(12) United States Patent
Challener et al.

(10) Patent No.: US 10,830,787 B2
(45) Date of Patent: Nov. 10, 2020

(54) OPTICAL ACCELEROMETERS FOR USE IN NAVIGATION GRADE ENVIRONMENTS

(71) Applicant: General Electric Company, Schenectady, NY (US)

(72) Inventors: William Albert Challener, Glenville, NY (US); Mengli Wang, Rexford, NY (US)

(73) Assignee: General Electric Company, Schenectady, NY (US)

( * ) Notice: Subject to any disclaimer, the term of this patent is extended or adjusted under 35 U.S.C. 154(b) by 275 days.

(21) Appl. No.: 15/968,668

(22) Filed: May 1, 2018

(65) Prior Publication Data

US 2019/0257853 A1    Aug. 22, 2019

Related U.S. Application Data

(60) Provisional application No. 62/632,698, filed on Feb. 20, 2018.

(51) Int. Cl.
| | |
|---|---|
| *G01P 15/093* | (2006.01) |
| *G01H 9/00* | (2006.01) |
| *G02B 26/02* | (2006.01) |
| *B81B 7/02* | (2006.01) |
| *G01P 15/08* | (2006.01) |
| *G01P 15/097* | (2006.01) |

(52) U.S. Cl.
CPC ............. *G01P 15/093* (2013.01); *B81B 7/02* (2013.01); *G01H 9/00* (2013.01); *G01P 15/0802* (2013.01); *G01P 15/097* (2013.01); *G02B 26/02* (2013.01); *B81B 2201/0235* (2013.01); *B81B 2203/0127* (2013.01); *B81B 2203/04* (2013.01)

(58) Field of Classification Search
CPC .. G01P 15/093; G01P 15/0802; G01P 15/097; G01H 9/00; G02B 26/02; B81B 7/02; B81B 2201/0235; B81B 2203/0127; B81B 2203/04
USPC ................................ 73/514.27, 497, 514.26
See application file for complete search history.

(56) References Cited

U.S. PATENT DOCUMENTS

| | | | |
|---|---|---|---|
| 4,422,331 A | 12/1983 | Walker | |
| 4,429,573 A | 2/1984 | Walker | |
| 5,063,781 A * | 11/1991 | Conforti | ................ G01H 9/006 |
| | | | 250/227.29 |

(Continued)

OTHER PUBLICATIONS

N.A.D. Stokes, R.M.A. Fatah and S. Venkatesh, "Self-excitation in Fibre-optic Microresonator Sensors", Sensors and Actuators, A21-A23 (1990), pp. 369-372.

(Continued)

*Primary Examiner* — Robert R Raevis
(74) *Attorney, Agent, or Firm* — Armstrong Teasdale LLP

(57) ABSTRACT

An accelerometer includes a membrane, an energy source producing a laser beam which is directed at the membrane causing it to vibrate, and a transparent cap disposed at one end of the energy source. The accelerometer includes a first controller for adjusting an output power of the energy source in a first feedback loop, a second controller for controlling the wavelength of the laser beam in a second feedback loop, and a detector sensing a reflected portion of the laser beam. An acceleration signal is based in part on the frequency of the reflected portion of the laser beam.

20 Claims, 25 Drawing Sheets

(56) References Cited

U.S. PATENT DOCUMENTS

| | | | |
|---|---|---|---|
| 5,359,445 A * | 10/1994 | Robertson | G01D 5/268 |
| | | | 250/227.14 |
| 6,712,274 B2 | 3/2004 | Dvorkis et al. | |
| 6,807,331 B2 | 10/2004 | Hsu et al. | |
| 7,137,299 B2 | 11/2006 | Meyer | |
| 9,618,531 B2 | 4/2017 | Painter et al. | |
| 2013/0327146 A1 | 12/2013 | Meyer et al. | |
| 2015/0177272 A1 | 6/2015 | Clark | |
| 2016/0221822 A1 * | 8/2016 | Krumbein | H04R 31/00 |

OTHER PUBLICATIONS

Palit, Challener, Lopez, Mandal, Xia, Jones, Craddock, Zhao, Irshad, MacDougall, Sanders, Herbst, Villiger, Vo, Henfling, Lindblom and Maldonado, "A Multi-Modality Fiber Optic Sensing Cable for Monitoring Enhanced Geothermal Systems", Thirty-Seventh Workshop on Geothermal Reservoir Engineering, Stanford University, Stanford, CA. Jan. 30-Feb. 1, 2012.

* cited by examiner

OPTICAL ACCELEROMETERS FOR USE IN NAVIGATION GRADE ENVIRONMENTS

CLAIM OF PRIORITY

This application claims priority to U.S. Application No. 62/632,698, filed on Feb. 20, 2018. The disclosure of U.S. Application No. 62/632,698 is incorporated herein by reference.

STATEMENT REGARDING FEDERALLY SPONSORED RESEARCH AND DEVELOPMENT

This invention was made with Government support under contract number N66001-16-C-4015 awarded by the Defense Advanced Research Projects Agency. The Government has certain rights in this invention.

BACKGROUND

The subject matter disclosed herein relates to a resonant opto-mechanical accelerometer and, more particularly, to a resonant opto-mechanical accelerometer for use in navigation grade environments.

At least some known accelerometers have been developed on micro-electro-mechanical systems ("MEMS") architectures. Some of these accelerometers may include a proof mass mounted on a piezoelectric substrate. As the proof mass experiences a change in acceleration, the proof mass compresses the piezoelectric substrate to generate an output current proportional to the acceleration of the proof mass. Other known accelerometers may include a deformable optical resonator that is compressed, like a piezoelectric substrate, when a proof mass coupled to the optical resonator experiences a change in acceleration.

Many such accelerometers have demonstrated high performance for targeting and inertial applications through the use of temperature post compensation at accelerations of approximately one µg, where one "g" corresponds to the acceleration due to gravity at the Earth's surface and is approximately equal to 9.806 m/s². However, such accelerometers may not be well suited to service under certain environmental conditions and may not exhibit a dynamic range of operation suitable for use with some inertial navigation systems.

BRIEF DESCRIPTION

In one aspect, an accelerometer is provided. The accelerometer includes a membrane, an energy source producing a laser beam which is directed at the membrane causing it to vibrate, and a transparent cap disposed at one end of the energy source. The accelerometer includes a first controller for adjusting an output power of the energy source in a first feedback loop, a second controller for controlling the wavelength of the laser beam in a second feedback loop, and a detector sensing a reflected portion of the laser beam. An acceleration signal is based in part on the frequency of the reflected portion of the laser beam.

In another aspect, a method of measuring acceleration is provided. The method includes providing a membrane within a laser beam, oscillating the membrane with energy from the laser beam, adjusting the temperature of a source of the laser beam, causing a wavelength of the laser beam to modulate, and adjusting a power output of the source of the laser beam, causing an amplitude of the laser beam to modulate. The method further includes detecting at least one variation in the oscillating membrane, and providing at least one signal representative of an oscillation of the membrane to both a first feedback loop and a second feedback loop. Adjusting the temperature of a source of the laser beam uses at least one input from the first feedback loop. Adjusting a power output of the source of the laser beam uses at least one input from the second feedback loop. An acceleration signal is based in part on the frequency of an amplitude modulation of a reflected portion of the laser beam.

In another aspect, an optical accelerometer is provided. The optical accelerometer includes an energy source producing a laser beam, a membrane at least partially disposed within the laser beam, and a laser power controller for adjusting an output power of the energy source causing an amplitude of the laser beam to modulate. The optical accelerometer further includes a temperature controller for adjusting the temperature of the energy source causing a wavelength of the laser beam to modulate, and a detection device sensing at least one oscillation of the membrane. The laser power controller and the temperature controller are both arranged in a feedback loop with the detection device to maintain the oscillation of the membrane. An acceleration signal is based in part on the frequency of an amplitude modulation of a reflected portion of the laser beam.

DRAWINGS

These and other features, aspects, and advantages of the present disclosure will become better understood when the following detailed description is read with reference to the accompanying drawings in which like characters represent like parts throughout the drawings, wherein.

Figure 1:
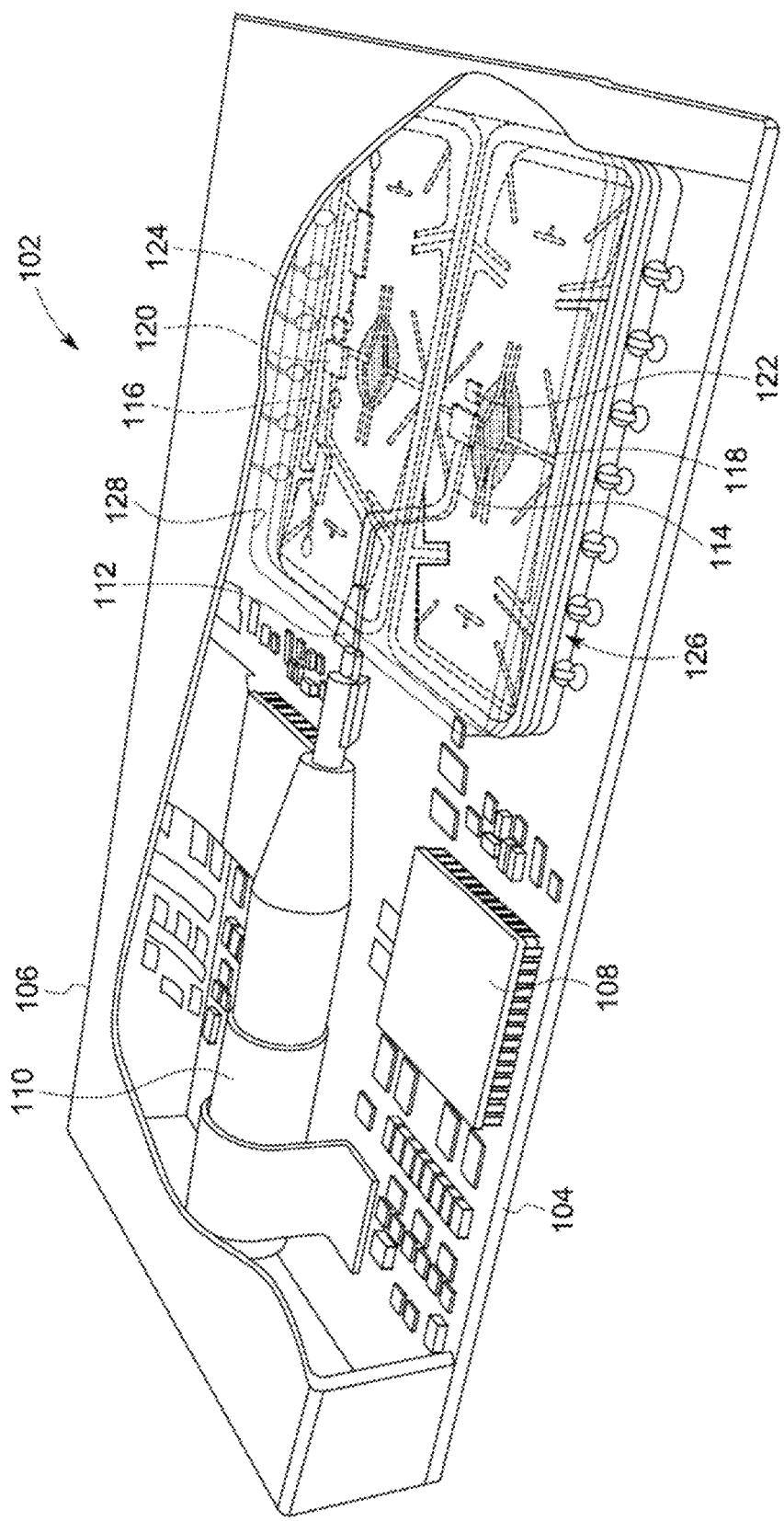
FIG. 1 is a perspective view of an exemplary resonant opto-mechanical accelerometer.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer" and related terms, e.g., "processing device," "computing device", and "controller" are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory includes, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with a user interface such as a mouse and a keyboard. Alternatively, other computer peripherals may also be used that may include, for example, but not be limited to, a scanner. Furthermore, in the exemplary embodiment, additional output channels may include, but not be limited to, a user interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, "g-force" acceleration is a measurement of acceleration caused by a mechanical force exerted on a body, such as an accelerometer, in a direction by a surface supporting the object and preventing the object from free fall. Similarly, as used herein, a unit of measurement of acceleration may be expressed as a "g," which in the international system of units, corresponds to $m/s^2$. One g is thus the acceleration due to gravity at the Earth's surface and is approximately equal to 9.806 $m/s^2$.

Embodiments of the present disclosure relate to a resonant opto-mechanical accelerometer and, more particularly, to a resonant opto-mechanical accelerometer for use in navigation grade environments. As described herein, navigation grade environments include environments associated with and/or onboard various navigational systems, such as, for example, aircraft systems, marine systems, terrestrial systems, and/or munitions systems, such as missile and other ballistic systems. As such, navigation grade environments may expose the resonant opto-mechanical accelerometer to rapidly fluctuating g-forces as well as to extreme environmental conditions.

In addition, as described below, the resonant opto-mechanical accelerometer may be a single axis accelerometer (e.g., a z-axis accelerometer) configured to measure acceleration perpendicular to a resonator plane. However, the resonant opto-mechanical accelerometer may also measure accelerations about other axes (e.g., depending upon the orientation of the accelerometer) and may, in addition, measure accelerations about a plurality of axes (e.g., where a plurality of resonator and/or resonator pairs are utilized).

The resonant opto-mechanical accelerometer includes a light source, such as a laser, a first resonator, and a second resonator. A resonance frequency of each resonator is responsive to an acceleration, and the light source shines a light beam on each resonator. The resonators modulate the light to a frequency that corresponds to the resonance frequency, and the modulated light is sensed at each resonator by a corresponding photodetector. The photodetectors generate first and second electrical output signals in response, and these electrical output signals are used to generate a temperature independent acceleration measurement. More particularly, the first and second resonator are operated as a pair, each having and opposite scale factor, to provide robustness against common mode errors, such as temperature drift. Moreover, a plurality of electrodes are disposed in relation to each resonator, such that one or more proof masses associated with each resonator may be dynamically balanced and/or a scale factor associated with the modulated light increased or decreased as a function of acceleration.

FIG. 1 is a perspective view of an exemplary resonant opto-mechanical accelerometer ("ROMA") 102. ROMA 102 includes a printed circuit board ("PCB") 104. A controller 108 is mounted on PCB 104. As described elsewhere herein, controller 108 coordinates the operation of ROMA 102. In the exemplary embodiment, controller 108 includes one or more processors communicatively coupled to one or more tangible, non-transitory, computer-readable memories.

A light source 110 is also mounted on PCB 104. Light source 110 is any light source capable of generating a beam of monochromatic light and/or any other beam of radiation. In the exemplary embodiment, light source 110 is a laser, such as a continuous-wave laser and/or a pulsed operation laser. Light source 110 may, in addition, be a low power laser, such as, in some embodiments, a laser having an output power ranging from ten milliwatts to fifty milliwatts. Further, in various embodiments, more than one light source may be implemented with ROMA 102. Light source 110 may be operatively coupled to controller 108, such that controller 108 provides one or more control instructions or control signals to light source 110 for the operation of light source 110.

An optical waveguide 112 is coupled to light source 110, such that optical waveguide 112 is capable of receiving and guiding a light beam generated by light source 110. In the exemplary embodiment, optical waveguide 112 is bifurcated and branches into a first branch or first portion 114 and a second branch or second portion 116. Optical waveguide 112 includes any waveguide suitable for the transmission of light, such as any light guide, any fiber optic waveguide structure, any integrated waveguide structure patterned on a cover of ROMA 102 (as described below), and the like.

A first photodetector 122 is disposed at a first output coupler or first end 118 of first portion 114. Similarly, a second photodetector 124 is disposed at a second output coupler or second end 120 of second portion 116. First end 118 may include a mirror, prism reflector, or grating coupler (not shown) configured to redirect a beam of light traveling within first portion 114 of optical waveguide 112 towards a first resonator 126. Likewise, second end 120 may include a mirror, prism reflector, or grating coupler (not shown) configured to redirect a beam of light traveling within second portion 116 of optical waveguide 112 towards a second resonator 128.

In the exemplary embodiment, first resonator 126 and second resonator 128 are mounted on PCB 104 and form a resonator package or resonator pair. In other embodiments, first resonator 126 and/or second resonator 128 are not mounted on PCB 104, and may be located or mounted apart from PCB 104, controller 108, and/or other control electronics.

First resonator 126 and/or second resonator 128 are operatively coupled to controller 108, such that controller 108 provides one or more control instructions or control signals to first resonator 126 and/or second resonator 128 for the operation of first resonator 126 and/or second resonator 128. For example, in some embodiments, controller 108 provides one or more control signals to first resonator 126 and/or second resonator 128 to control the voltages generated by one or more electrodes coupled to each resonator 126 and/or 128 (as described below). Similarly, in various embodiments, controller 108 provides one or more control signals to first resonator 126 and/or second resonator 128 to control the output power of light source 110.

ROMA 102 may, in addition, be enclosed within a housing 106, which may serve as an environmental enclosure suitable to shelter ROMA 102 from air and moisture. In some embodiments, housing 106 is also heat resistant and functions as a heat shield suitable to shelter ROMA 102 from heat generated by a navigation or propulsion system to which ROMA 102 is mounted or coupled.

Figure 2:
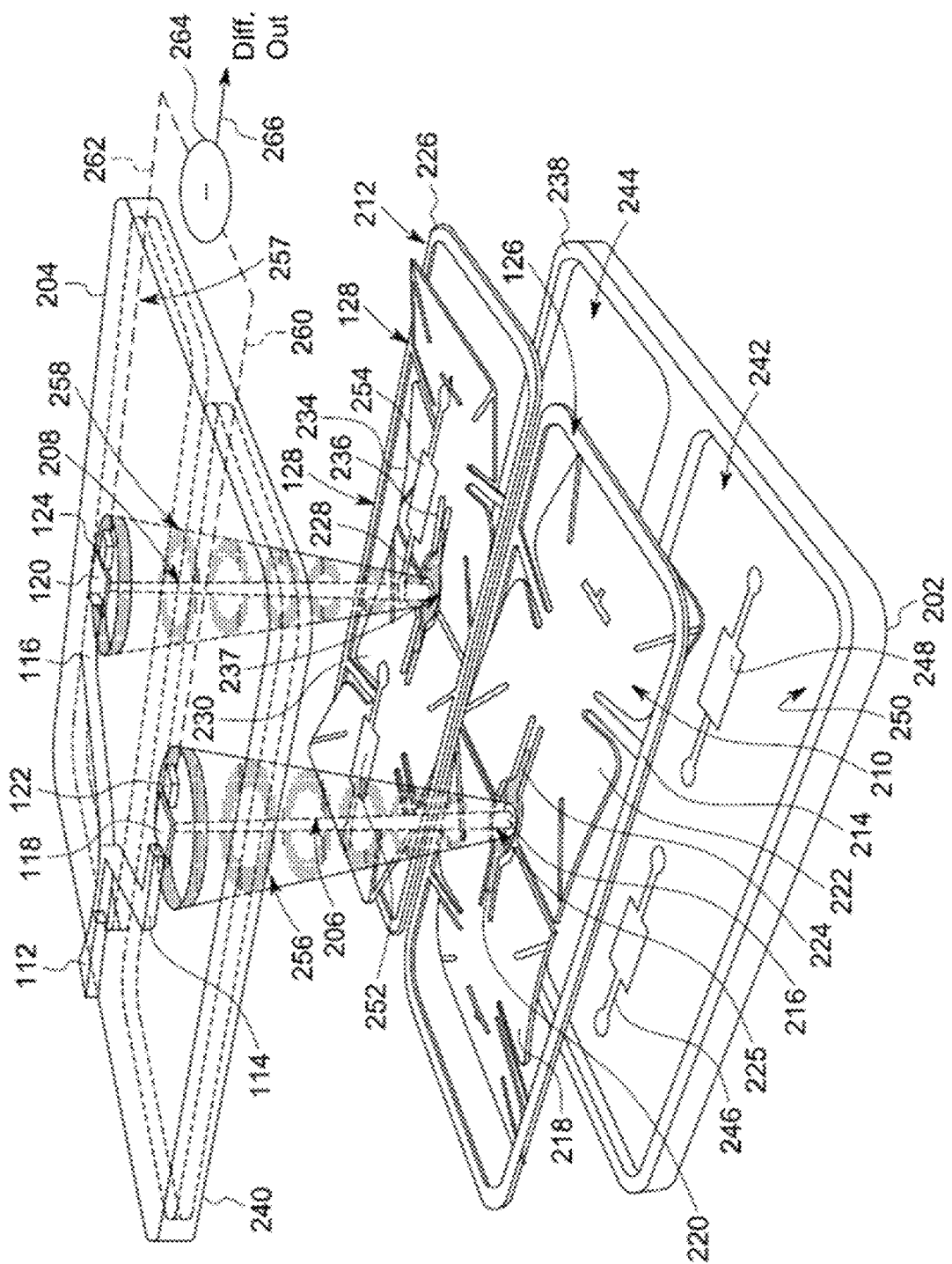
FIG. 2 is an exploded view of an exemplary resonator pair of the resonant opto-mechanical accelerometer shown in FIG. 1.

FIG. 2 is an exploded view of first resonator 126 and second resonator 128. As shown, first resonator 126 and second resonator 128 are substantially identical. In addition, first resonator 126 and second resonator 128 are mounted between a substrate 202 and a cover 204. Substrate 202 and cover 204 are manufactured as micro-electro-mechanical systems ("MEMS") wafers, such as silicon-on-insulator ("SOI") wafers. For example, substrate 202 and cover 204 may be manufactured as SOI wafers and/or as floated borosilicate glass (e.g., PYREX) wafers. In the exemplary embodiment, substrate 202 is manufactured as an SOI wafer, and cover 204 is manufactured as a PYREX wafer.

However, in various embodiments, cover 204 is manufactured as an SOI wafer and is not substantially absorptive to light, such as light having a wavelength of approximately 1300 nanometers. As a result, cover 204 transmits and reflects light, such that one or more excitation signals, such as, for example, a first light beam 206 and a second light beam 208, are able to pass through cover 204. For example, light at a wavelength of 1300 nanometers may be 20% reflected by cover 204 and 80% transmitted. Thus, cover 204 may absorb some light, but in some embodiments, the absorption should be minimal. For example, in some embodiments, the absorption is less than 10%. If it is desired to make cover 204 from a transparent material, such as glass, such that cover 204 does not reflect a substantial amount of light, a separate thin film layer (not shown) may be deposited on cover 204 to obtain the desired reflectance. For example, a layer of $Ta_2O_5$ having a thickness between 100 and 250 nanometers can be deposited onto a glass cover 204 to obtain a reflectance of approximately 20% to 25%. Accordingly, as used here, "transparent" means that light is able to be transmitted, at least partially, and with or without some attenuation through cover 204.

Excitation by light source 110 may result in amplitude self-stabilized oscillation frequencies and may improve frequency stability. In addition, optical interactions may serve to decouple conventional quality factor and gain detection trade-offs and may simplify device fabrication by facilitating uniform, large-gap, layouts as opposed to micron-sized electrode spacing within high aspect ratio etching steps. Further, the optical drive and readout features described herein may reduce or eliminate traditional error sources, such as errors introduced as a result of AC and/or DC drive signals applied to conventional electrostatic MEMS devices.

First resonator 126 includes a first proof mass 210. First proof mass 210 includes a first mounting perimeter 214, a central portion 216, a first leaf or a first portion 218, a first spring 220, a second leaf or a second portion 222, and a second spring 224. First portion 218 is coupled to central portion 216 by first spring 220, and second portion 222 is coupled to central portion 216 by second spring 224. Thus, first resonator 126 may be referred to as a "tuning fork" or "butterfly pattern" resonator. In some embodiments, first resonator 126 may also be a multiple beam opto-mechanical resonator that uses an out-of-plane linear vibrational oscillation. More generally, first resonator 126 may include any suitable resonator geometry or form factor. Central portion 216 may include a first reflective and absorptive surface or coating 225, which may be deposited on the surface of first resonator 126 that is closest to cover 204. If first resonator 126 is non-absorbing, first reflective coating 225 may also be deposited the surface of first resonator 126 that is furthest from the cover 204. However, in various embodiments, first reflective coating 225 cannot be a perfect reflector, and must permit some portion of first light beam 206 shining upon its surface to pass into central portion 216 for absorption.

Likewise, second resonator 128 includes a second proof mass 212. Second proof mass 212 includes a first mounting perimeter 226, a central portion 228, a first leaf or a first portion 230, a first spring 232, a second leaf or a second portion 234, and a second spring 236. First portion 230 is coupled to central portion 228 by first spring 232, and second portion 234 is coupled to central portion 228 by second spring 236. Thus, second resonator 128 may be referred to as a "tuning fork" or "butterfly pattern" resonator. Central portion 228 may include a second reflective surface or coating 237, which may be deposited on the surface of second resonator 128 that is closest to cover 204. If second resonator 128 is non-absorbing, second reflective coating 237 may also be deposited on the surface of second resonator 128 that is furthest from cover 204. However, in some embodiments, second reflective coating 237 cannot be a perfect reflector, and must permit some portion of second light beam 208 shining upon its surface to pass into central portion 228 for absorption.

During manufacturing, first proof mass 210 and second proof mass 212 are bonded or mounted between substrate 202 and cover 204. Specifically, first mounting perimeter 214 of first proof mass 210 is bonded or mounted between a substrate mounting surface 238 of substrate 202 and a cover mounting surface 240 of cover 204, such that first proof mass 210 is suspended between substrate 202 and cover 204 within a first cavity 242 defined between substrate 202 and cover 204. Similarly, first mounting perimeter 226 of second proof mass 212 is bonded or mounted between substrate mounting surface 238 of substrate 202 and cover mounting surface 240 of cover 204, such that second proof mass 212 is suspended between substrate 202 and cover 204 within a second cavity 244 defined between substrate 202 and cover 204. First cavity 242 and second cavity 244 may be sealed and filled with a gas or a mixture of gases, sealed under vacuum, and/or manufactured to include an aperture or opening (not shown) through which a gas or mixture of gases may be introduced into or evacuated from the device.

In addition, in the exemplary embodiment, a first electrode 246 and a second electrode 248 are bonded or mounted on an internal surface 250 of substrate 202, such that first electrode 246 is disposed substantially in proximity to, or under, first portion 218 of first proof mass 210, and second electrode 248 is disposed substantially in proximity to, or under, second portion 222 of first proof mass 210. In addition, a third electrode 252 and a fourth electrode 254 are bonded or mounted on an internal surface 257 of cover 204, such that third electrode 252 is disposed substantially in proximity to, or over, first portion 230 of second proof mass 212, and fourth electrode 254 is disposed substantially in proximity to, or over, second portion 234 of second proof mass 212.

In operation, and as described in greater detail below, first light beam 206 is directed by optical waveguide 112 through cover 204 onto central portion 216 of first proof mass 210, and second light beam 208 is directed by optical waveguide 112 through cover 204 onto central portion 228 of second proof mass 212. Each proof mass 210 and 212 oscillates or vibrates at a particular resonance frequency (as described in greater detail below) under the influence of an applied acceleration (or g force).

As first light beam 206 makes contact with central portion 216 of first proof mass 210, a reflected portion 256 of first light beam 206 is reflected by first reflective coating 225, and an absorbed portion of first light beam 206 is absorbed, as heat energy, by central portion 216. Reflected portion 256 is modulated to the resonance frequency of first proof mass 210 as it reflects from central portion 216 of first proof mass 210.

This modulation may be variously accomplished. For example, with respect to first resonator 126, the surfaces of cover 204 reflect some light, as does first resonator 126, such as, for example, central portion 216 of first proof mass 210. These surfaces form an optical cavity 310 having a length, L, and the reflected light from these surfaces interferes when it recombines at first photodetector 122 to cause the total reflected light intensity on first photodetector 122 to vary with the length, L, of optical cavity 310 between cover 204 and central portion 216. The variation is periodic with distance and the period is equal to half of the wavelength of light within optical cavity 310. Therefore, as resonator 126 vibrates, thereby changing the length, L, of optical cavity 310, the light intensity on photodetector 122 may also vary synchronously with the vibration of resonator 126. Other techniques may also be used to generate an oscillating light intensity on photodetector 122, such as depositing a reflective mirror (not shown) on a portion of resonator 126 that moves in and out of first light beam 206 as first resonator 126 vibrates, and/or fabricating a structure within ROMA 102 that partially shadows or prevents first light beam 206 from striking first resonator 126, where the amount of shadowing may vary as resonator 126 vibrates. These modulation techniques may be applied, in similar fashion, to second resonator 128.

Likewise, as second light beam 208 makes contact with central portion 228 of second proof mass 212, a reflected portion 258 of second light beam 208 is reflected by second reflective coating 237, and an absorbed portion of second light beam 208 is absorbed, as heat energy, by central portion 228. Reflected portion 258 is modulated to the resonance frequency of second proof mass 212 as it reflects from central portion 228 of second proof mass 212.

Thus, the frequencies associated with reflected portions 256 and 258 correspond to the resonance frequencies of first proof mass 210 and second proof mass 212, respectively, which depend upon the acceleration on ROMA 102 as well as the electromechanical stiffnesses of each proof mass 210 and 212.

As reflected portion 256 is reflected back through cover 204, reflected portion 256 is received by first photodetector 122. Similarly, as reflected portion 258 is reflected back through cover 204, reflected portion 258 is received by second photodetector 124. In response, first photodetector 122 generates a first electrical output signal 260 proportional to the frequency of received reflected portion 256, and second photodetector 124 generates a second electrical output signal 262 proportional to the frequency of received reflected portion 258.

First electrical output signal 260 and second electrical output signal 262 are transmitted (e.g., over one or more electrical wires) to an electrical circuit 264, such as a frequency counter or phase-locked-loop ("PLL"), that is configured to analyze first electrical output signal 260 and second electrical output signal 262, and, based upon the analysis, to output either digital or analog signals that are related to the oscillation frequency of resonators 126 and 128 and, in some embodiments, to other parameters such as the temperature of resonators 126 and 128. The digital signals from resonators 126 and 128 may in turn be subtracted from each other with either analog or digital electronics to provide an acceleration signal 266 that is representative of the acceleration measured by ROMA 102. Specifically, in the exemplary embodiment, electrical circuit 264 is configured to subtract one of first electrical output signal 260 and second electrical output signal 262 from the other. The difference between the two signals 260 and 262 corresponds to the acceleration on ROMA 102 and is provided as acceleration signal 266. Moreover, as described below, acceleration signal 266 is temperature independent.

Figure 3:
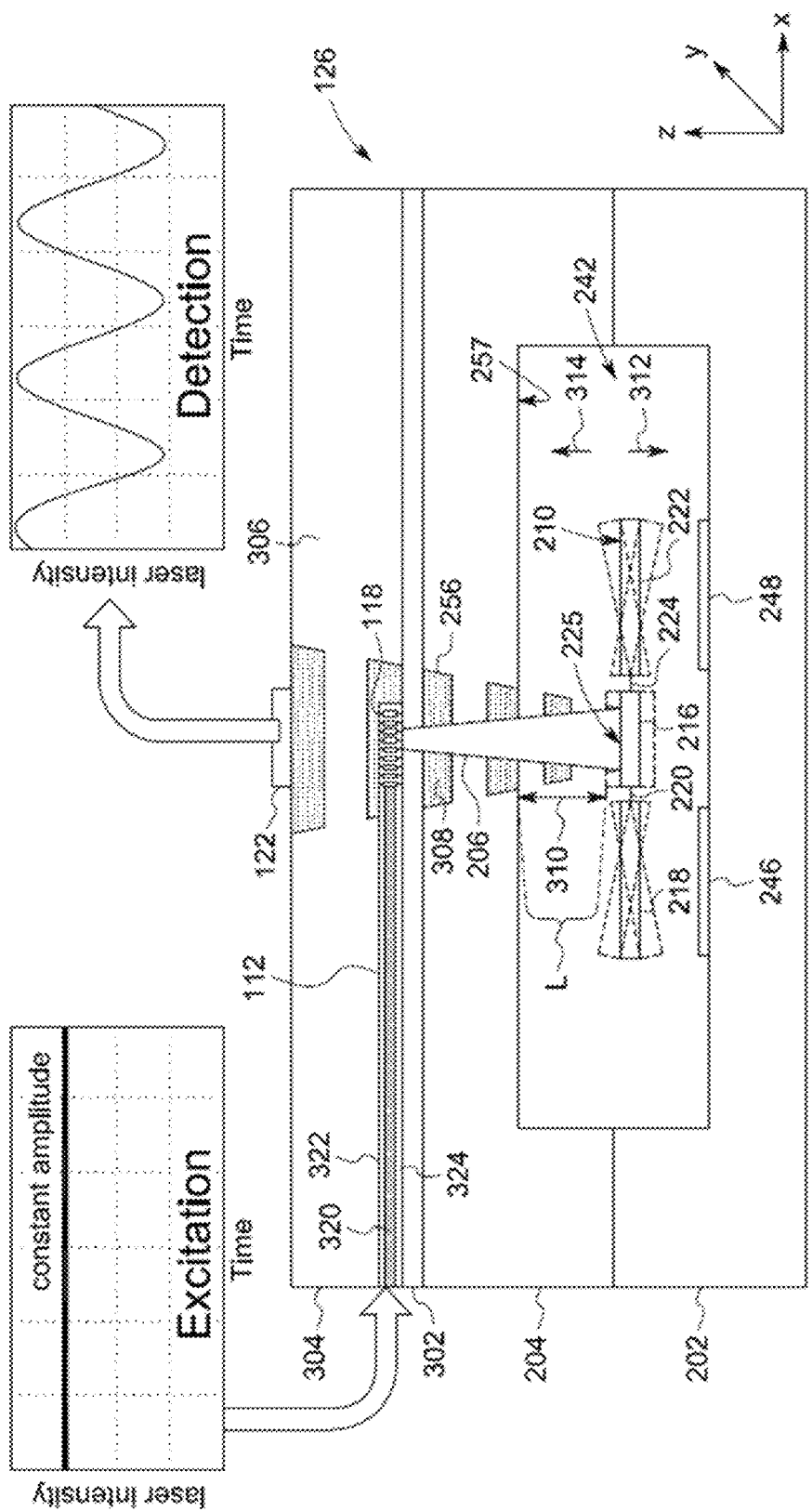
FIG. 3 is a schematic view of an exemplary resonator of the resonant opto-mechanical accelerometer shown in FIG. 1.

FIG. 3 is a schematic view of resonator 126 of ROMA 102 (shown at FIG. 1). Although resonator 126 is described with respect to FIG. 3, the same description applies to resonator 128.

Accordingly, resonator 126 includes, in addition to the elements described above, a cap 302 and a window 304. As described above, waveguide 112 terminates in first end 118 (e.g., an output coupler) that is constructed on either cap 302 or window 304. Waveguide 112 may be composed of a high refractive index core layer 320, such as a SiN or Si core layer, which may be surrounded above by a first low index layer 322 and below by a second low index layer 324. First low index layer 322 and second low index layer 324 may be manufactured from, for example, $SiO_2$. Because waveguide 112 may be directly attached to cover 204, the cladding material between core layer 320 and the cover 204 may be sufficiently thick to substantially prevent laser light leakage from core layer 320 into cover 204. For example, first low index layer 322 and second low index layer may be about 2 microns in thickness, which is generally sufficient to prevent substantial light leakage from core layer 320 into the cover 204. In addition, and in various embodiments, first photodetector 122 is mounted on an outer surface 306 of window 304.

As described above, central portion 216 of first resonator 126 may include a reflective surface coating, such as first reflective surface coating 225, on either or both surfaces to partially reflect light towards photodetector 122, thus forming optical cavity 310 for the purpose of generating modulated light intensity. In various embodiments, the reflected light intensity should be about 20%, but, in at least some embodiments, is preferably less than 50%. Moreover, the reflective coating, such as first reflective coating 225, should not absorb a significant amount of the laser light. For example, the absorption should be less than 5% in some embodiments, and, in other embodiments, is preferably much less than 1%.

In the exemplary embodiment, optical cavity 310 is a Fabry-Pérot cavity and is configured to produce a standing light wave interference absorption and reflection pattern to allow for optical self-oscillation and detection by using only a single constant power light source (e.g., light source 110)

As described previously, the reflectance of optical cavity 310 varies with the length, L, of optical cavity 310 between central portion 216 of first resonator 126 and cover 204, and this generates an optical signal that is measured by photodetector 122. For instance, when the reflected light intensity is large, then the amount of light absorbed in first resonator 126 (and/or a thin film on first resonator 126), is small, and vice-versa. Therefore, as first resonator 126 vibrates, the amount of light that it is absorbed is also oscillating synchronously. The absorbed light heats central portion 216 of first resonator 126 and can cause its mechanical properties to vary (as described in greater detail below).

For example, Young's modulus may be applied to describe the amount of strain in first resonator 126 as a function of applied stress. Specifically, the modulus may vary with temperature and, hence, with the vibration of first resonator 126. Variation in Young's modulus changes the stiffness of the first spring 220 and second spring 224, which directly affects the resonance frequency of first resonator 126. The dimensions of first resonator 126 may also vary due to the coefficient of thermal expansion of first resonator 126. For example, heating first resonator 126 will cause it to expand, which will in turn cause it to bend and change the length, L, of optical cavity 310. With a properly designed ROMA 102, when first resonator 1026 is located at a positon of high absorption, the absorbed light heats first resonator 126 and causes it to move to a location of lower absorption by changing the length, L, of optical cavity 310. With less absorbed light, first resonator 126 then cools down slightly and moves back into a position of larger absorption. The process repeats itself, causing first resonator 126 to oscillate at its natural frequency.

For example, as first spring 220 and second spring 224 increase in temperature, first portion 218 and second portion 222 may experience increased mechanical displacement about the z-axis as a result of acceleration of ROMA 102, because the stiffness of first spring 220 and second spring 224 have decreased. Conversely, as first spring 220 and second spring 224 decrease in temperature, first portion 218 and second portion 222 may experience decreased mechanical displacement about the z-axis as a result of acceleration of ROMA 102, because the stiffness of first spring 220 and second spring 224 have increased. Thus, as the temperature of resonator 126 varies, first proof mass 210 and second proof mass 212 may oscillate about the z-axis with increasing and/or decreasing resonance frequency.

In the exemplary embodiment, a first voltage may be applied to first electrode 246, and a second voltage may be applied to second electrode 248, to compensate for the change in temperature and/or to adjust the resonance frequency of first proof mass 210. For example, as the voltage generated by first electrode 246 is adjusted, the electrostatic force between first electrode 246 and first portion 218 of first proof mass 210 may vary, such that the electromechanical stiffness of first portion 218, which is suspended from central portion 216 by spring 220, increases and decreases with corresponding increases and decreases in voltage. Similarly, as the voltage generated by second electrode 248 is adjusted, the electrostatic force between second electrode 248 and second portion 222 of first proof mass 210 may vary, such that the electromechanical stiffness of second portion 222, which is suspended from central portion 216 by spring 224, increases and decreases with corresponding increases and decreases in voltage.

These changes in electromechanical stiffness affect the resonance frequency of first proof mass 210 during operation. For example, as the electromechanical stiffness of first proof mass 210 increases, the resonance frequency of first proof mass 210 may also increase, and as the electromechanical stiffness of first proof mass 210 decreases, the resonance frequency of first proof mass 210 may also decrease. An increasing and/or decreasing voltage may thus be applied between first electrode 246 and/or second electrode 248 and first proof mass 210 to adjust the electromechanical stiffness of first proof mass 210 and, in turn, the resonance frequency of first proof mass 210.

In addition, as reflected portion 256 of first light beam 206 reflects from central portion 216, reflected portion 256 travels along the z-axis within optical cavity 310 and reflects from the top and bottom surfaces of cover 204 back towards central portion 216. In other words, reflected portion 256 bounces back and forth between central portion 216 and the surfaces of the cover within optical cavity 310. Some of this reflected light escapes optical cavity 310 (as reflected portion 256) and travels along the z-axis towards photodetector 122, where it is converted, as described above, into first electrical output signal 260, which is proportional to the resonance frequency of resonator 126.

Thus, ROMA 102 detects acceleration based, in part, upon the frequency of reflected portion 256 of first light beam 206. As described above, however, the same resonation and detection processes occur within resonator 128, where second photodetector 124 converts reflected portion 258 of second light beam 208 into second electrical output signal 262.

More particularly, in the exemplary embodiment, first electrode 246 of first resonator 126 applies a bias voltage under first portion 218 of first proof mass 210, and second electrode 248 of first resonator 126 applies a bias voltage under second portion 222 of first proof mass 210. These bias voltages may, for example, increase the electromechanical stiffness of first proof mass 210 in a first direction 312 along the z-axis (because first proof mass 210 is attracted and/or repulsed by the electrostatic force developed as a result of the bias voltages), such that first proof mass 210 oscillates at a first resonance frequency in response to an acceleration in either first direction 312 or second direction 314.

Similarly, third electrode 252 of second resonator 128 applies a bias voltage over first portion 230 of second proof mass 212, and fourth electrode 254 of second resonator 128 applies a bias voltage over second portion 234 of second proof mass 212. These bias voltages may, for example, increase the electromechanical stiffness of second proof mass 212 in a second direction 314 along the z-axis (because second proof mass 212 is attracted and/or repulsed by the electrostatic force developed as a result of the bias voltages), such that second proof mass 212 oscillates at a second resonance frequency in response to an acceleration in either first direction 312 or second direction 314.

As a result of these opposing bias voltages, ROMA 102 may operate such that, as the resonance frequency of first resonator 126 increases, the resonance frequency of second resonator 128 decreases (and vice versa). Moreover, if the bias voltages applied to each resonator 126 and 128 are substantially equivalent, the difference between the first resonance frequency of first proof mass 210 and the second resonance frequency of second proof mass 212 will correspond to the actual acceleration upon ROMA 102. For example, differential output signal 266 will not be affected by the temperature of ROMA 102, because the variations in the first resonance frequency and the second resonance frequency arising as a result of temperature fluctuations will cancel in the difference calculation performed by electrical circuit 264 (as described above). ROMA 102 is thus capable of detecting acceleration independent of temperature.

As the acceleration on ROMA 102 varies during operation, it may be desirable to increase and/or decrease a scale factor associated with one or both of first resonator 126 and second resonator 128 to improve the dynamic range of ROMA 102. For example, as the acceleration on ROMA 102 increases, it may be desirable to increase and/or decrease the scale factor associated with one or both of first resonator 126 and/or second resonator 128. Similarly, as the acceleration on ROMA 102 decreases, it may be desirable to increase and/or decrease the scale factor associated with one or both of first resonator 126 and second resonator 128.

To adjust the scale factor, the bias voltages generated by one or more of first electrode 246, second electrode 248, third electrode 252, and/or fourth electrode 254 may be increased and/or decreased. For example, at large accelerations, the resonance frequencies of first resonator 126 and second resonator 128 may fluctuate rapidly. To accommodate for this frequency instability, one or more electrodes 246, 248, 252, and/or 254 may be controlled (e.g., by controller 108) to increase and/or decrease the bias voltage applied to first proof mass 210 and/or second proof mass 212. For example, as the bias voltage is increased, the resonance frequency of each proof mass 210 and 212 may also increase. Thus, the resonance frequencies of first proof mass 210 and second proof mass 212 may be scaled up and down to accommodate increases and decreases in acceleration. In some embodiments, ROMA 102 may detect g forces ranging from 0 g to 50,000 g.

First resonator 126 and/or second resonator 128 may also be dynamically balanced as part of an initial calibration function and/or during operation. More particularly, first portion 218 of first proof mass 210 and second portion 222 of first proof mass 210 may vary slightly in mass (e.g., due to imperfections in the manufacturing process). Similarly, first portion 230 of second proof mass 212 and second portion 234 of second proof mass 212 may vary slightly in mass. These small deviations in mass may unbalance first proof mass 210 and second proof mass 212, such that the resonance frequencies of first resonator 126 and second resonator 128 are affected.

To balance first resonator 126 and/or second resonator 128, one or more bias voltages may be applied, as described above, to either or both of first proof mass 210 and/or second proof mass 212. In particular, first electrode 246 and second electrode 248 may apply one or more bias voltages to first proof mass 210, and third electrode 252 and fourth electrode 254 may apply one or more bias voltages to second proof mass 212.

In another embodiment, vibrating MEMS may be used for measurement of acceleration in an inertial sensor device. These devices include a thin vibrating silicon membrane suspended in vacuum inside a small container made of silicon, glass, or other materials. The oscillation of the membrane is achieved via laser light. A constant (CW) laser beam incident through the container upon the correct location of the membrane can cause the membrane to oscillate continuously, and the oscillation frequency is found to be extremely stable, to 1 ppb or better, as long as the temperature of the device is held constant. If the temperature of the sensor is varies by approximately 1° C., the device stops oscillating.

Figure 4:
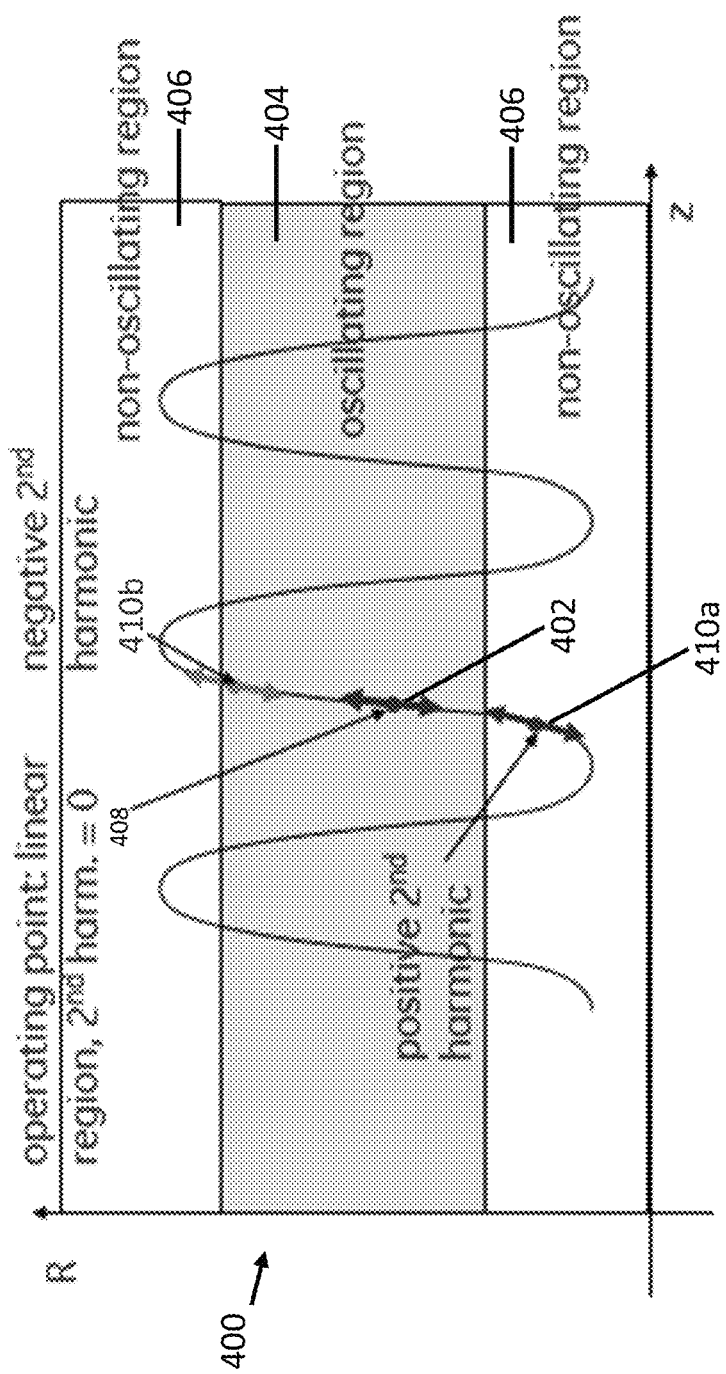
FIG. 4 is a diagram illustrating reflectance as a function of gap thickness between the cap and membrane.
Figure 5:
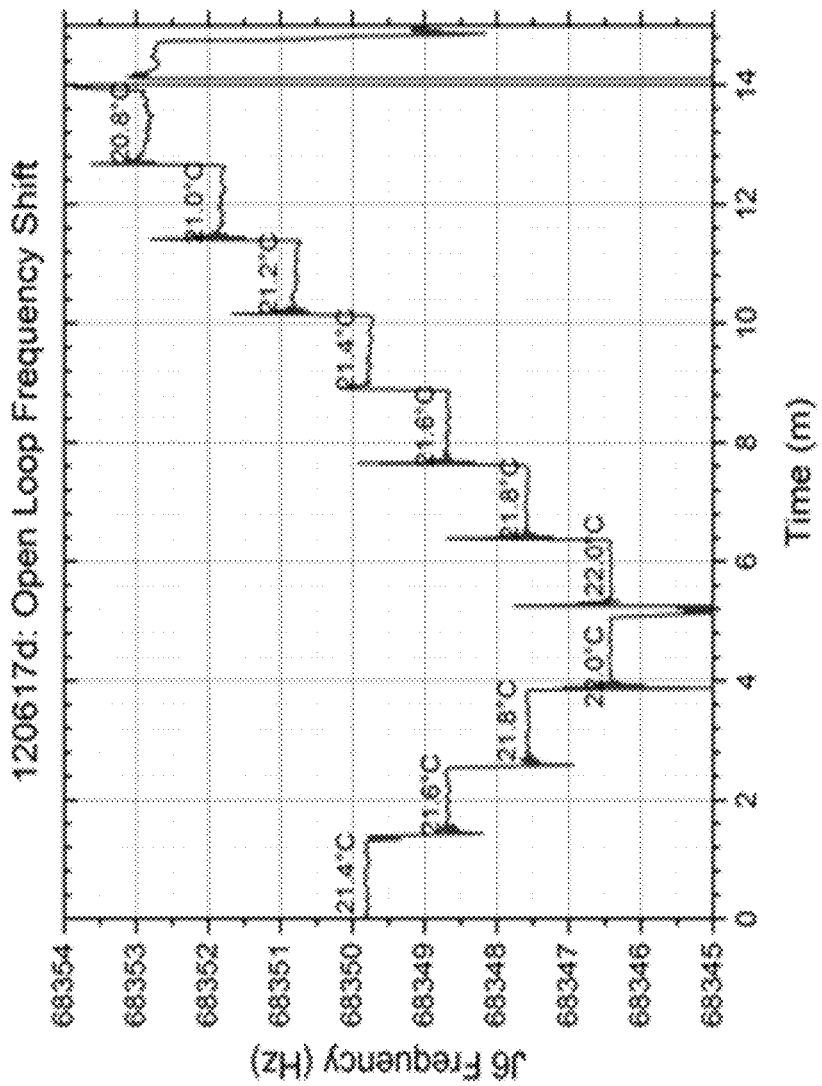
FIG. 5 is a diagram illustrating oscillation frequency of a MEMS device.

The resonating membrane forms an optical cavity with the cap of the device. As the temperature of the device changes, the thickness of the cap and the thickness of the gap between the cap and membrane also varies. Moreover, the refractive index of the cap varies. An appropriate antireflection coating on one side of the cap can eliminate most of the effect of cap thickness and refractive index variation. Without an antireflection coating, however, the operating point 402 on the reflectivity curve 400 changes as shown in FIG. 4. If the device temperature changes sufficiently, the device reaches a region in which it can fail to oscillate. The oscillation frequency of one MEMS device is shown in FIG. 5 as device temperature was varied. The device stopped oscillating at 20.6° and 22.2° C. The measured frequency shift with device temperature was −5.35 Hz/° C.

FIG. 4 illustrates reflectance as a function of gap thickness between the cap and membrane. The largest signal at the fundamental frequency of the membrane occurs in the linear oscillating region 404. As the gap changes to cause the operating point to move towards either region 406, the size of the signal decreases and the laser feedback that causes the membrane to oscillate also decreases, until finally the device may stop oscillating.

Even without applying antireflection coatings to the outer surface of the cap, it is possible to enable the device to operate over a much larger temperature range than 1° C. This is accomplished through careful control of the laser power and temperature. For narrow linewidth laser diodes, typically called "distributed feedback laser diodes" or just DFB laser diodes, changing the laser temperature causes the laser wavelength to change. Changing the laser current causes the laser output power to change, and also has a small effect on laser wavelength. Initially a single feedback loop was implemented on this device in which the second harmonic 410 signal amplitude was used as the error signal. If the membrane is oscillating around the proper operating point, in the linear range 408 of reflectance change as a function of gap thickness, then the second harmonic 410 should be zero. If the vacuum gap begins to increase, then the operating point slides in one direction towards either a minimum or maximum reflectivity. The membrane oscillation then enters a nonlinear region 406 where a second harmonic 410 signal is generated. Because the curvature of the reflectance curve changes sign around the operating point, the amplitude of the second harmonic can be used as an error signal for the feedback loop. In particular, if an electronic phase locked loop is synchronized to the fundamental resonant frequency and used to monitor the second harmonic frequency amplitude (through use of a lock-in amplifier, for example), it is found that the second harmonic amplitude increases in the positive direction for temperature drifts in one direction, and the second harmonic amplitude increases in the negative direction for temperature drifts in the other direction. Therefore, the second harmonic amplitude can be used as an error signal in an electronic feedback loop to correct for temperature drifts of the device. The second harmonic 410 amplitude can be input to a proportional/integral/differential (PID) control circuit and the output of that circuit can then be used to control the laser temperature, which in turn changes the laser wavelength to compensate for changes in the device temperature. As illustrated in FIG. 4, a positive second harmonic 410a or a negative second harmonic 410b may result.

Figure 6:
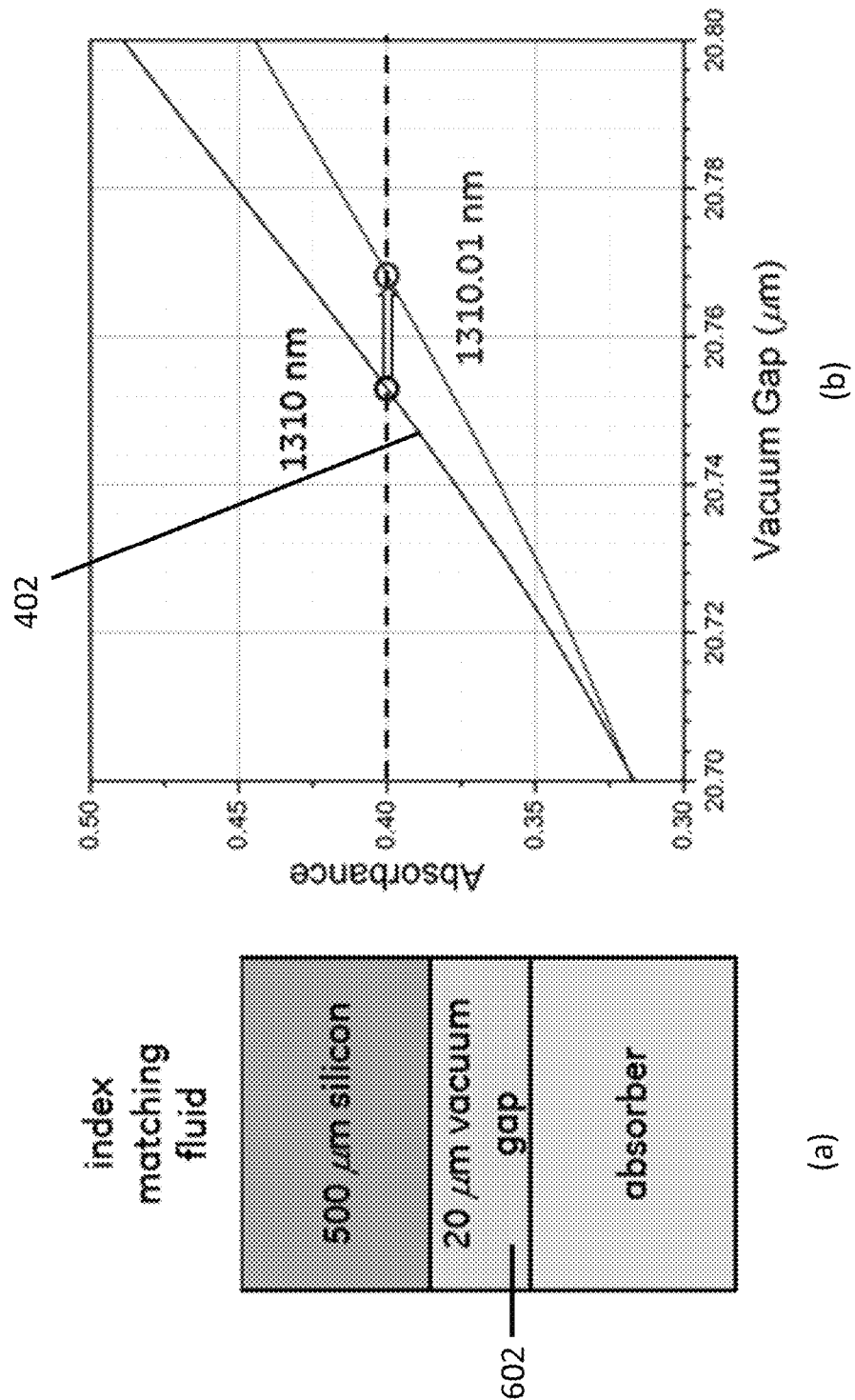
FIG. 6 illustrates a film stack model and absorbance as a function of vacuum gap thickness.

FIG. 6 illustrates (a) a film stack model, and (b) absorbance as a function of vacuum gap thickness. When the vacuum gap 602 increases from ~20.75 μm to ~20.77 μm due to thermal expansion, the feedback loop causes the laser wavelength to automatically shift from 1310 nm to 1310.01 nm to maintain the absorbance and operating point 402 fixed so that the membrane continues to oscillate. The absorbance of the membrane as a function of membrane position or vacuum gap 602 thickness in turn is modified as shown in FIG. 6 so that the operating point 402 moves back into a linear region 404.

Figure 7:
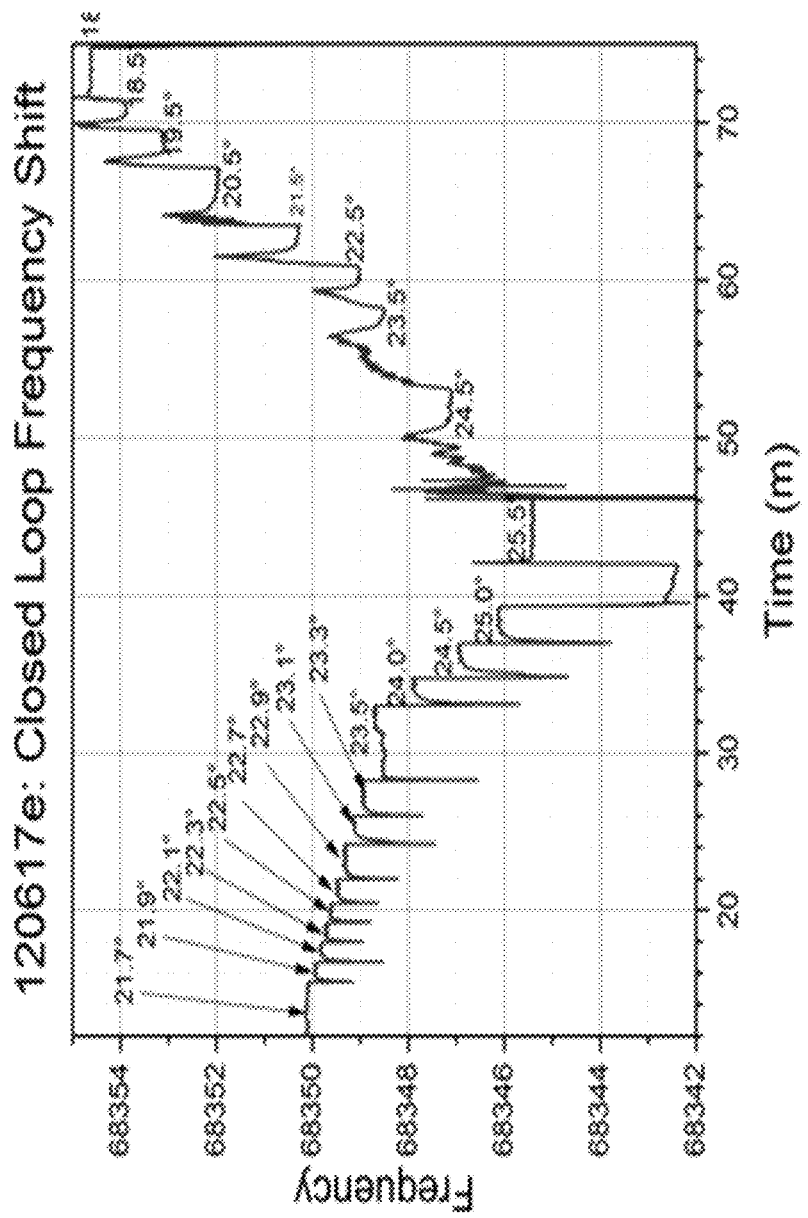
FIG. 7 illustrates oscillation frequency of a MEMS device as a function of device temperature.

FIG. 7 illustrates oscillation frequency of a MEMS device as the device temperature was varied and a feedback loop was closed in which the second harmonic signal was used as the error signal to control laser temperature. This feedback circuit was implemented on the same device as previously measured. As shown in FIG. 7, the device temperature could now be varied over 8° C. and still exhibit self-oscillation. The slope of the frequency change with temperature was also greatly reduced to −1.2 Hz/° C. from the case with open loop.

At the ends of this temperature range, it was noticed that the signal amplitude at the fundamental resonant frequency was dropping. This may be due to the change in slope of the absorbance, which is the driving force for the self-oscillation, that is evident in FIG. 6 as the operating point 402 shifts. By implementing a second feedback loop that controls laser output power, it is possible to maintain device operation over a temperature range of at least 48° C., even when the laser light is reflected at both surfaces of the cap. The second feedback loop stabilizes the amplitude of the oscillating signal at the fundamental frequency. This feedback loop is essentially an automatic gain control (AGC). As the detected signal at the fundamental frequency drops or increases in amplitude, the current to the laser is increased or decreased, respectively, to maintain a constant amplitude at the fundamental frequency. This AGC loop is designed to operate relatively quickly, perhaps at ten or 100 times faster than that of the first feedback loop.

Figure 8:
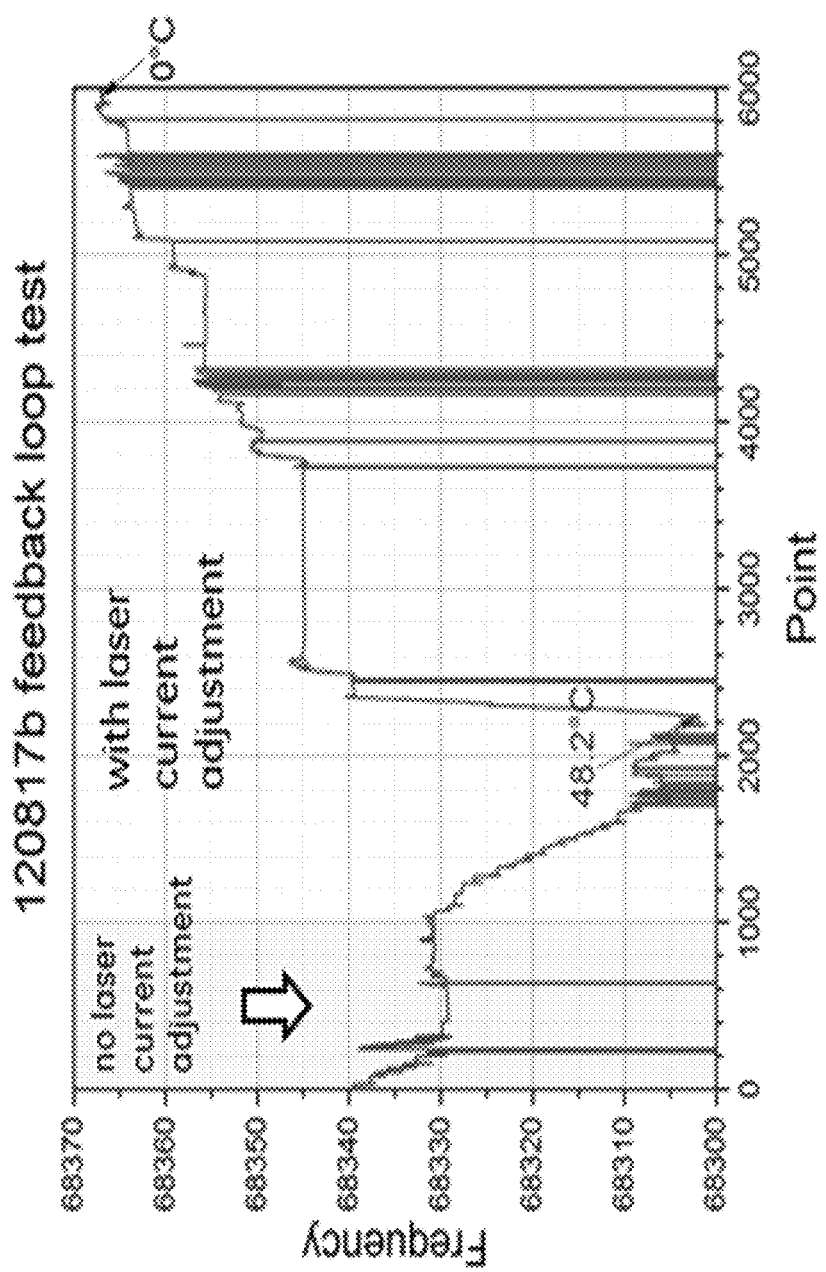
FIG. 8 illustrates dual feedback loop testing results.

The dual feedback loop was tested by using an automatic electronic PID loop for the second harmonic 410 as in the previously described feedback measurement, and manually adjusting the laser current in response to changes in fundamental signal amplitude as shown in FIG. 8. Stated otherwise, a human being took the place of an electronic AGC. In this manner, the device was able to self-oscillate down to at least 0° C. and up to at least 48.2° C. As laser output power is able to be varied over a wider range, the self-oscillation range of the MEMS device may also be increased allowing for accurate sensing over a wider temperature range beyond the 0° C. to 48.2° C. demonstrated. For example, as laser output power variation increases from 50% to 300% and beyond, the temperature range through which the MEMS device would be expected to sense accurately would similarly increase to a temperature range of several hundred ° C.

Figure 8A:
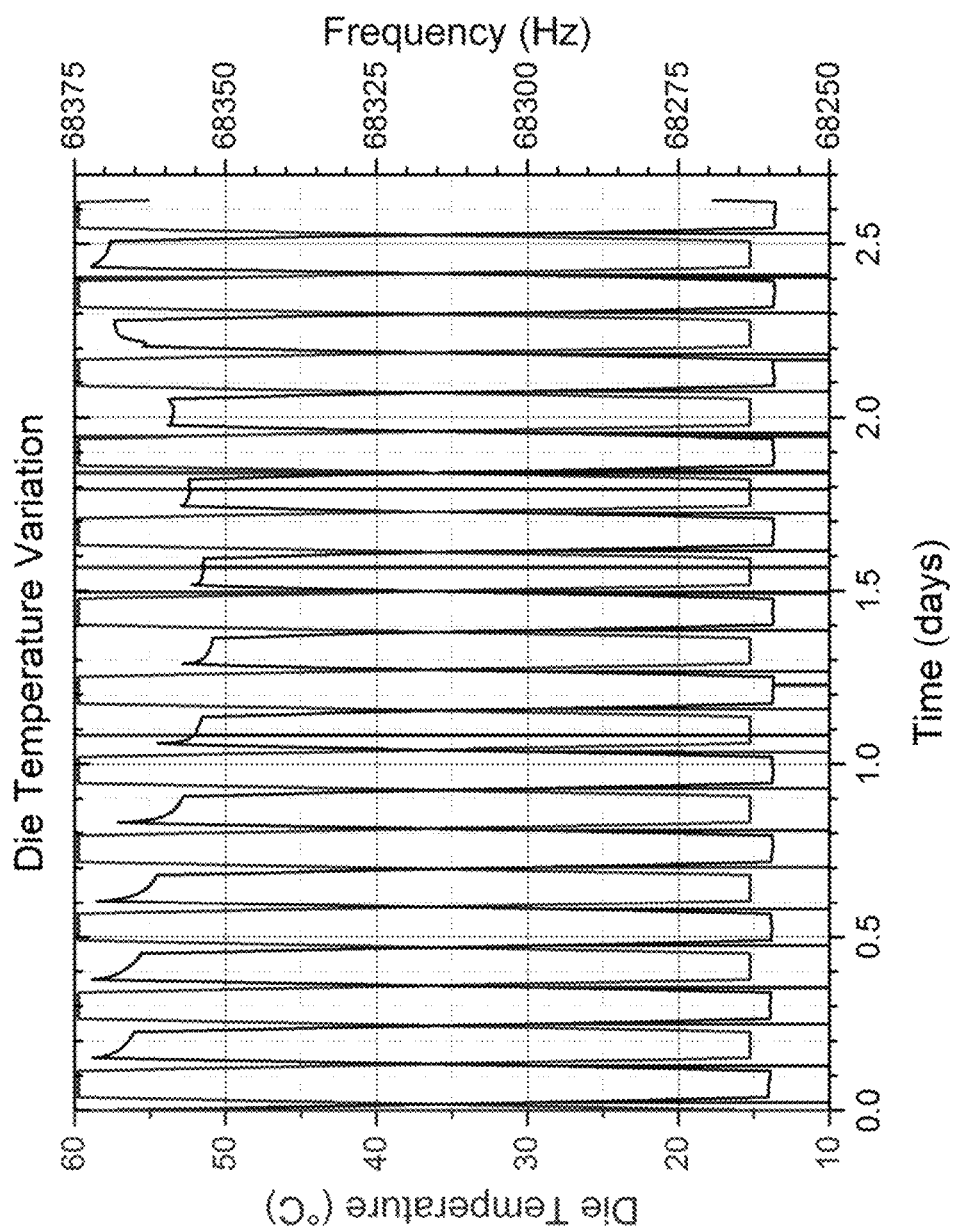
FIG. 8A illustrates dual feedback loop testing results using automatic adjustments.

Instead of an electronic feedback loop, it is also possible to precalibrate the laser and device so that at a given device temperature, the optimum laser temperature and current are already known. Then as the device temperature changes, the laser can be automatically adjusted in an appropriate manner to maintain device oscillation even without requiring a feedback circuit. In practice, when there are two resonant devices that respond similarly to temperature but differently to acceleration, one of these devices can be used to determine the device temperature in order to control the laser current and temperature so that the other device can monitor acceleration. An example of a device operating for 2½ days while its temperature was automatically ramped up and down between 15° C. and 60° C. and the laser current and temperature were automatically adjusted by computer control to maintain device oscillation is shown in FIG. 8A. As illustrated, the laser was calibrated to a temperature range from 10° C. and 65° C.

Figure 9:
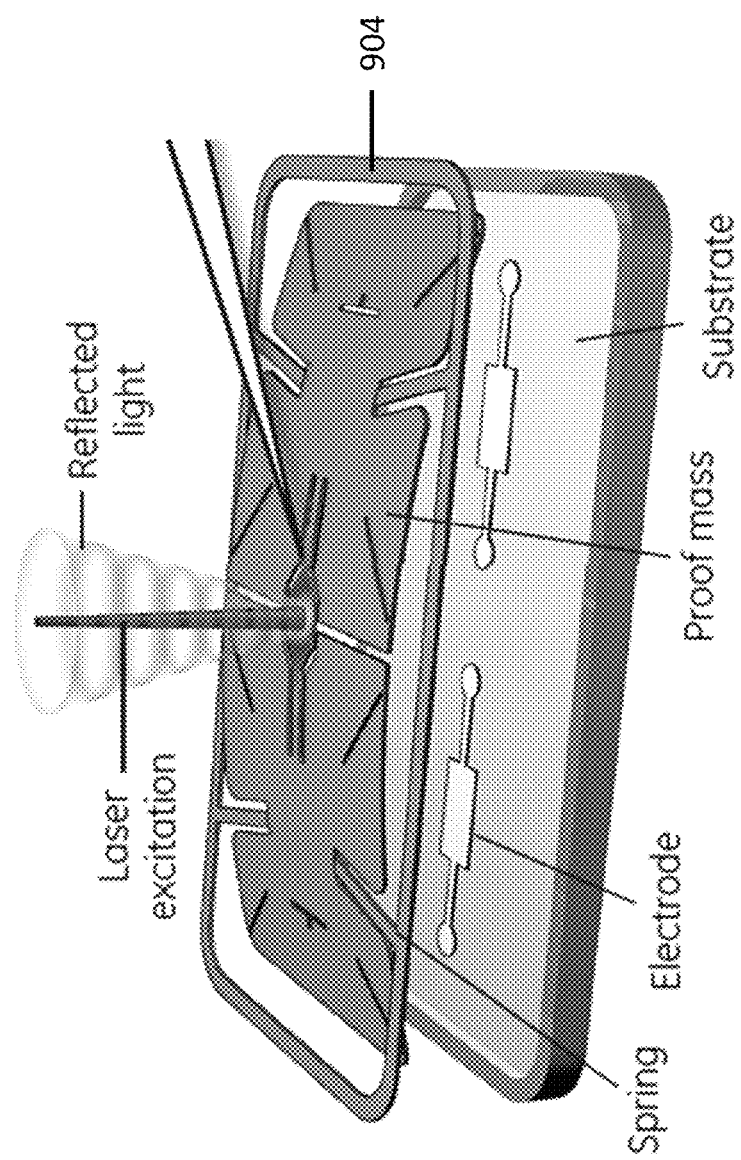
FIG. 9 illustrates an embodiment using optical fiber.

FIG. 9 illustrates another embodiment in which laser light 902 is brought to the MEMS sensor through an optical fiber that is carefully aligned to the sensor so that the laser light 902 is absorbed and reflected from a precise position on a resonant vibrating membrane 904 within the device. The membrane is enclosed in a vacuum-sealed chamber (not shown in the figure) which may be composed of silicon, glass, or other materials, or a combination of materials. The vibrating membrane may be configured in a "butterfly" accelerometer design, with multi-axis symmetry and "wing" structures, or in any other suitable configuration. The effect of a CW laser beam is to cause the resonant membrane 904 to oscillate. The frequency stability of certain device designs can be as good as one part in $10^9$ or better.

Experimentally, when the laser light is incident upon the membrane 904 through a silicon cap, it is found that the device is extremely sensitive to temperature changes. Small changes in device temperature can cause the resonant frequency to drift, which precludes using the device for measurement of acceleration. Moreover, the device is found to be extremely sensitive to laser wavelength. For example, a device may operate well with a laser at a wavelength of 1306 nm, and refuse to operate at the same laser power but at a laser wavelength of 1311 nm.

Figure 10:
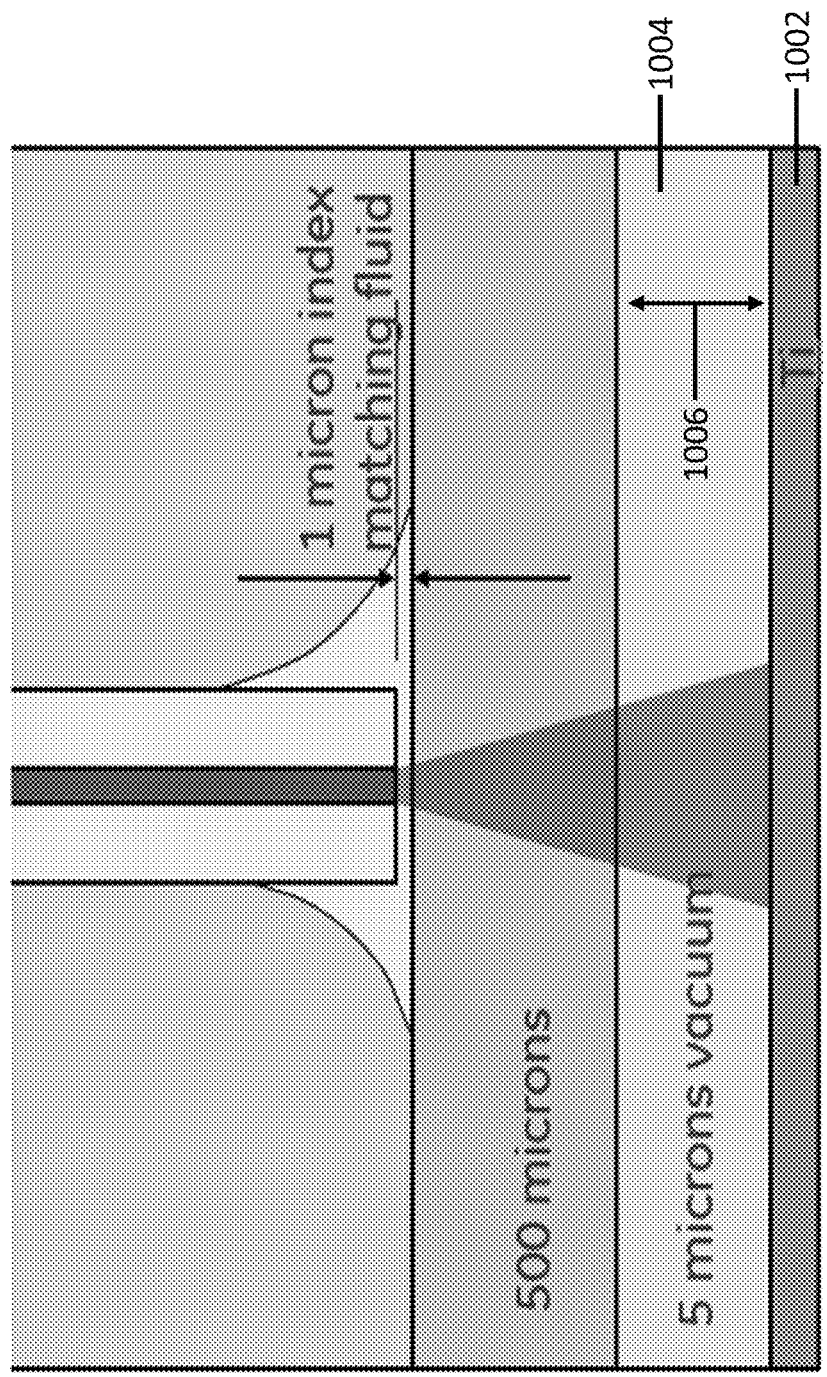
FIG. 10 illustrates an optical model of a sensor.
Figure 11:
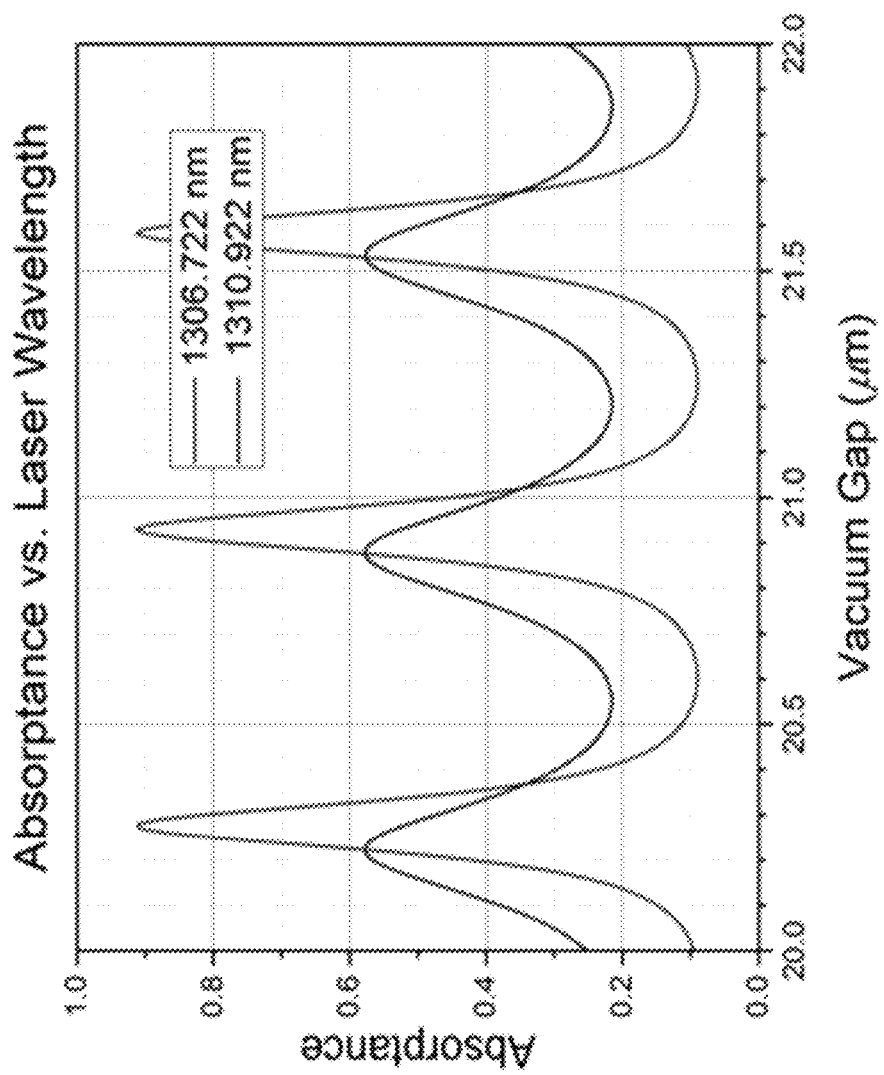
FIG. 11 illustrates vacuum gap thickness as a function of membrane vibration.

FIG. 10 illustrates an optical model of the sensor. The absorptance of the metal film 1002, which drives the membrane oscillation, was calculated as a function of vacuum 1004 gap thickness 1006 (which varies as the membrane vibrates) for the two laser wavelengths as shown in FIG. 11. Titanium, tungsten and other suitable metals may be used as the metal film 1002. Even though there is <5 nm change in laser wavelength, the different absorptance profiles are significant. At 1306 nm, the finesse of the optical system (essentially a measurement of the depth of the fringes and steepness of the curves) is much larger than that at 1311 nm. It is the slope of the absorptance curve that drives the membrane oscillation—a larger slope provides greater driving force to the membrane. Therefore, the optical model indicates that the cavity finesse at 1306 nm is more likely to excite the resonant mode than that at 1311 nm.

Figure 12:
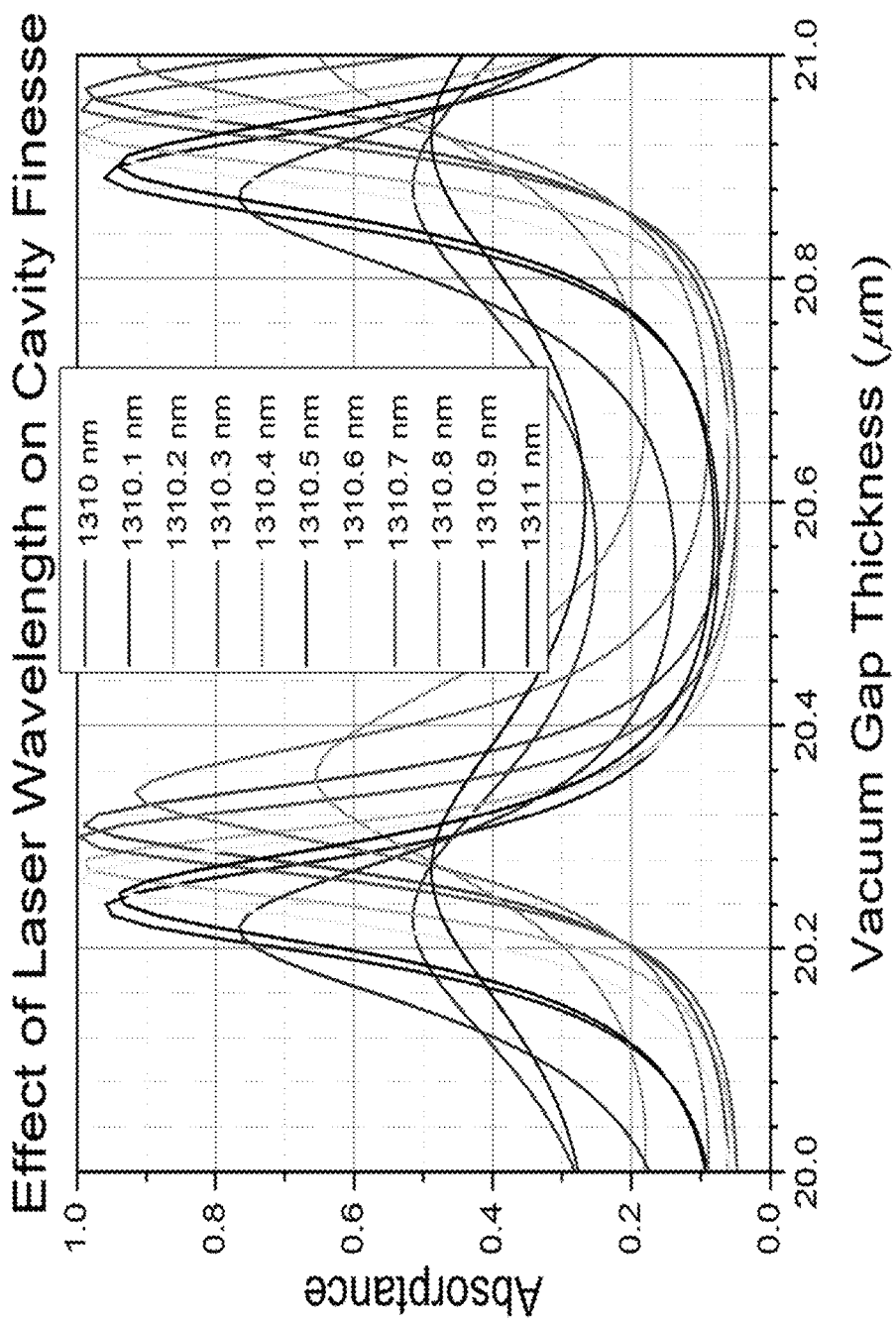
FIG. 12 illustrates the absorptance as a function of vacuum gap thickness.

Referring to FIG. 12, which illustrates the absorptance as a function of vacuum gap thickness 1006 for a Si cap at several different wavelengths, the cavity finesse was subsequently calculated as a function of laser wavelength over the wavelength range 1310 to 1311 nm in increments of 0.1 nm. As can be seen, the finesse is low at 1310 nm, rises to a peak, and then drops again, reaching another minimum between 1310.4 and 1310.5 nm, and a subsequent minimum at 1310.9 nm. The period of oscillation in laser wavelength of the finesse is thus ~0.45 nm.

Figure 13:
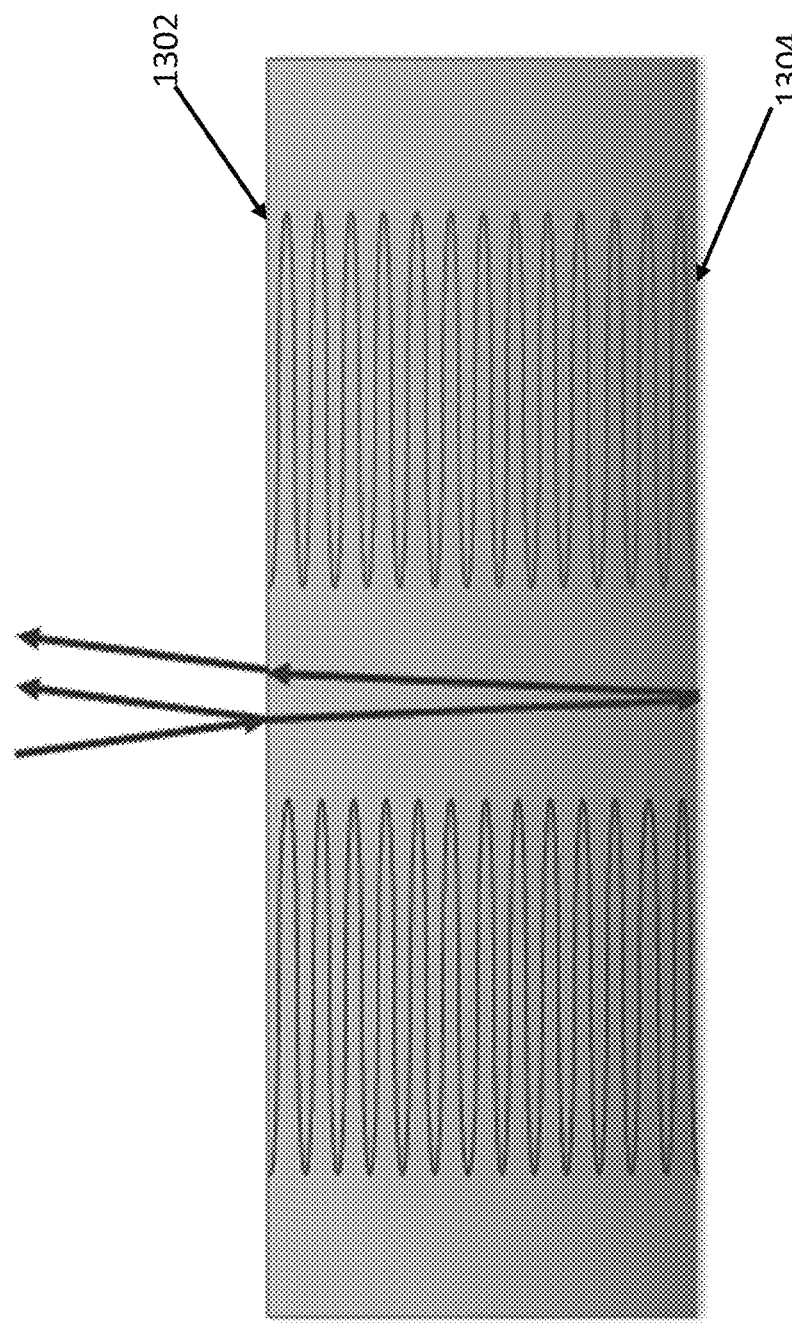
FIG. 13 illustrates the variation in finesse due to the cap optical thickness.

As illustrated in FIG. 13, the variation in finesse is due to the optical thickness of the Si cap. Laser light is reflected from both top 1302 and bottom 1304 surfaces of the Si cap as shown. For a 500 ㎛ cap thickness with a refractive index of 3.778, the roundtrip optical thickness of the cap is 3.778 mm. Both top 1302 and bottom 1304 surfaces cause variations in cavity finesse wavelength. This means that at a wavelength of 1310 nm, there are 2884 complete periods of the light in the round trip. Furthermore, when the wavelength changes by 0.45 nm, a similar calculation demonstrates that the number of periods in a round trip increases or decreases by 1. This explains the origin of the finesse variation with wavelength.

Referring still to FIG. 13, if the optical thickness of the cap changes, this will also cause the finesse of the cavity to vary. Optical thickness changes whenever the actual thickness and/or the optical refractive index changes. Both of these parameters can vary with changes in device temperature. The coefficient of thermal expansion for Si is $2.6\times10^{-6}$ $K^{-1}$. The thermo-optic coefficient of Si is $\sim1.8\times10^{-4}$ $K^{-1}$. Therefore, a temperature change of the Si cap by ~7° C. is sufficient to make one period variation in the cavity finesse. A 3.5° C. change in cap temperature will have the same effect as a 0.23 nm change in laser wavelength, potentially causing the device to shift from a self-oscillating state to a state which does not oscillate.

Figure 14:
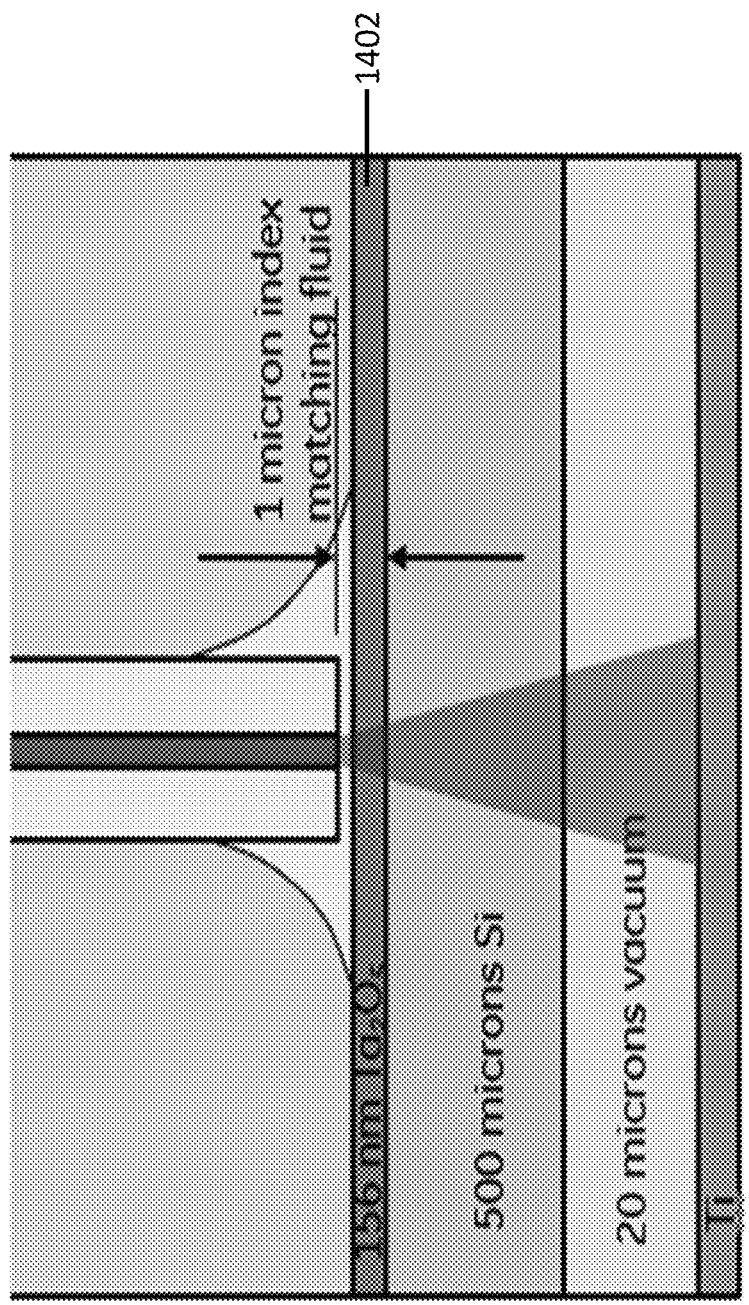
FIG. 14 illustrates the reflectance of the cap with a thin tantala film.

In order to eliminate this sensitivity to laser wavelength or device temperature, the reflection from one surface of the cap must be suppressed. One way to do this is to put an anti-reflection coating on one of the surfaces of the cap. A single layer anti-reflection (AR) coating is typically composed of a material that has an index of refraction intermediate between the two materials on either side of it, and an optical thickness that is a quarter wavelength. For example, if a 156 nm tantala thin film 1402 with a refractive index of 2.1 is deposited onto the outer surface of the Si cap as shown in FIG. 14, the reflectance from this surface drops to ~1%.

Figure 15:
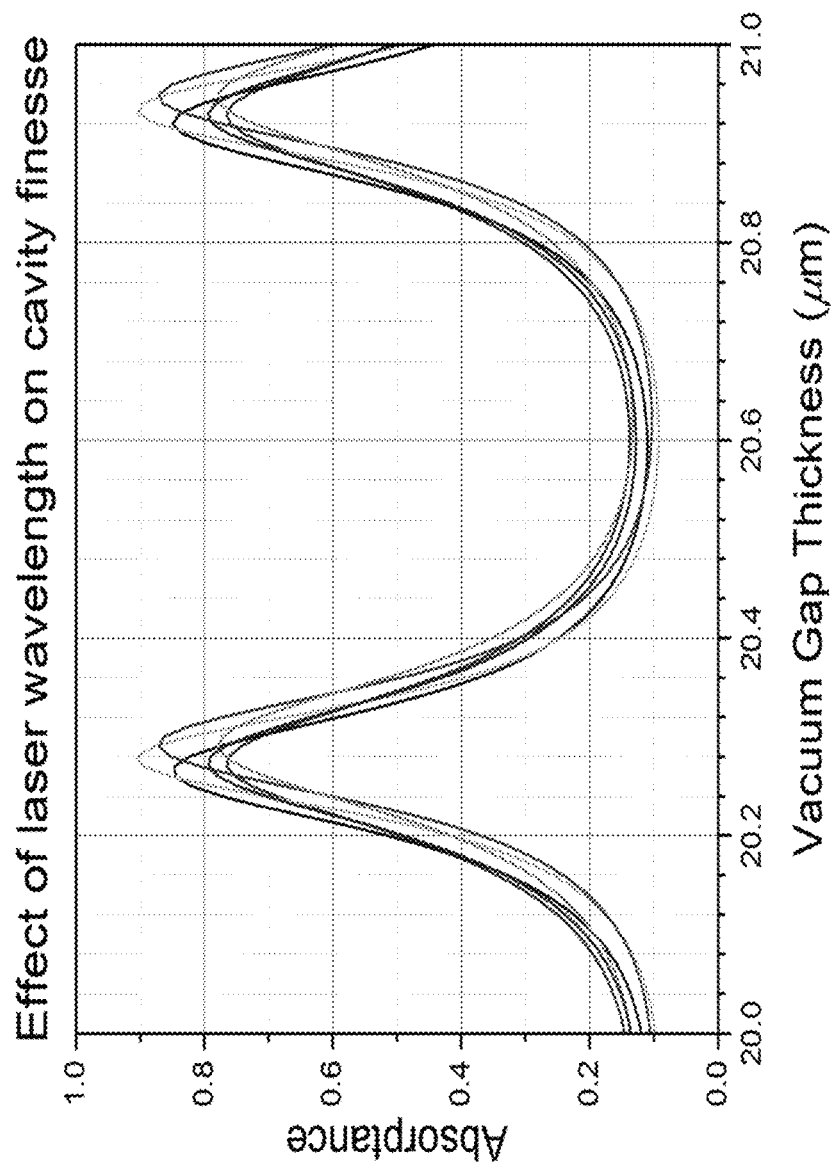
FIG. 15 illustrates the cavity finesse calculated at different wavelengths.

FIG. 15 illustrates the cavity finesse calculated at different wavelengths (similar to FIG. 12) when an anti-reflection coasting is applied to the top surface of the Si cap. The variation in absorptance/cavity finesse with laser wavelength has been greatly reduced compared to that in FIG. 12. The cavity finesse, however, is not as large as the finesse for the bare Si at its optimal wavelength. Further reduction in wavelength-dependence is possible by using a multilayer AR coating on the outside surface of the Si cap. Further increase in cavity finesse is possible by using a dielectric thin film reflector on the inside surface of the Si cap. An AR-coating on the inside surface of the Si cap and a dielectric reflector on the outside surface of the cap would also work to reduce the sensitivity of the device to temperature and laser wavelength, and increase the cavity finesse, respectively, but this is not as desirable as the first option because the greater optical distance between the outer Si cap surface and the membrane leads to larger secondary effects from thermal expansion of the Si cap.

Figure 16:
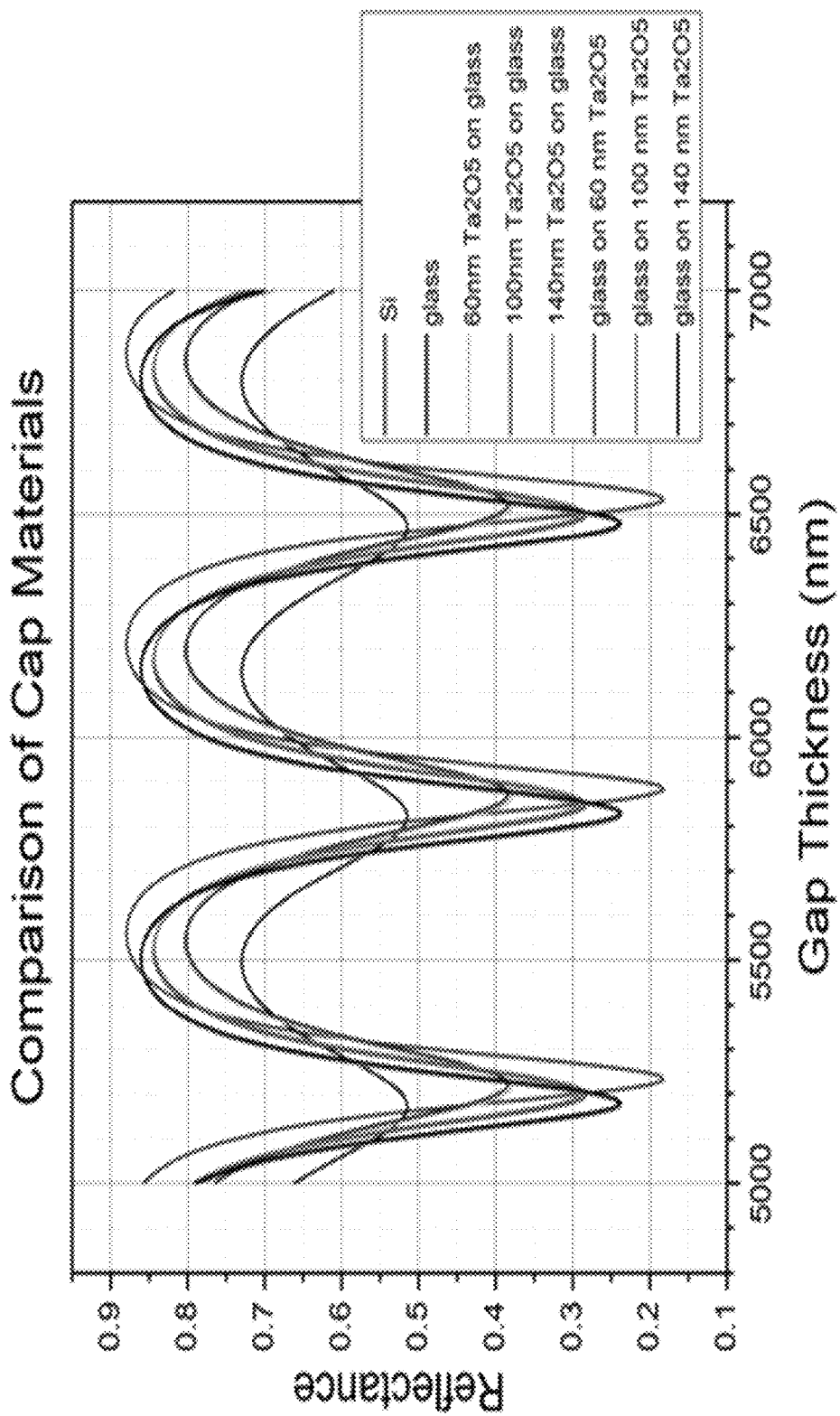
FIG. 16 illustrates cavity finesse for different cap materials.

Although it is generally better to fabricate the entire device from the same material, i.e., silicon, to eliminate strain in the device arising from different coefficients of thermal expansion between different materials, it is possible to replace the silicon cap with glass for use over a more limited temperature range. Calculations of the cavity finesse for a silicon cap, a glass cap, and a glass cap with a single thin film reflector layer are shown in FIG. 16. As can be seen, neither the bare glass nor the glass with a single reflector layer performs as well as (i.e., has as large a finesse as) the bare silicon. The bare glass performs particularly poorly.

Figure 17:
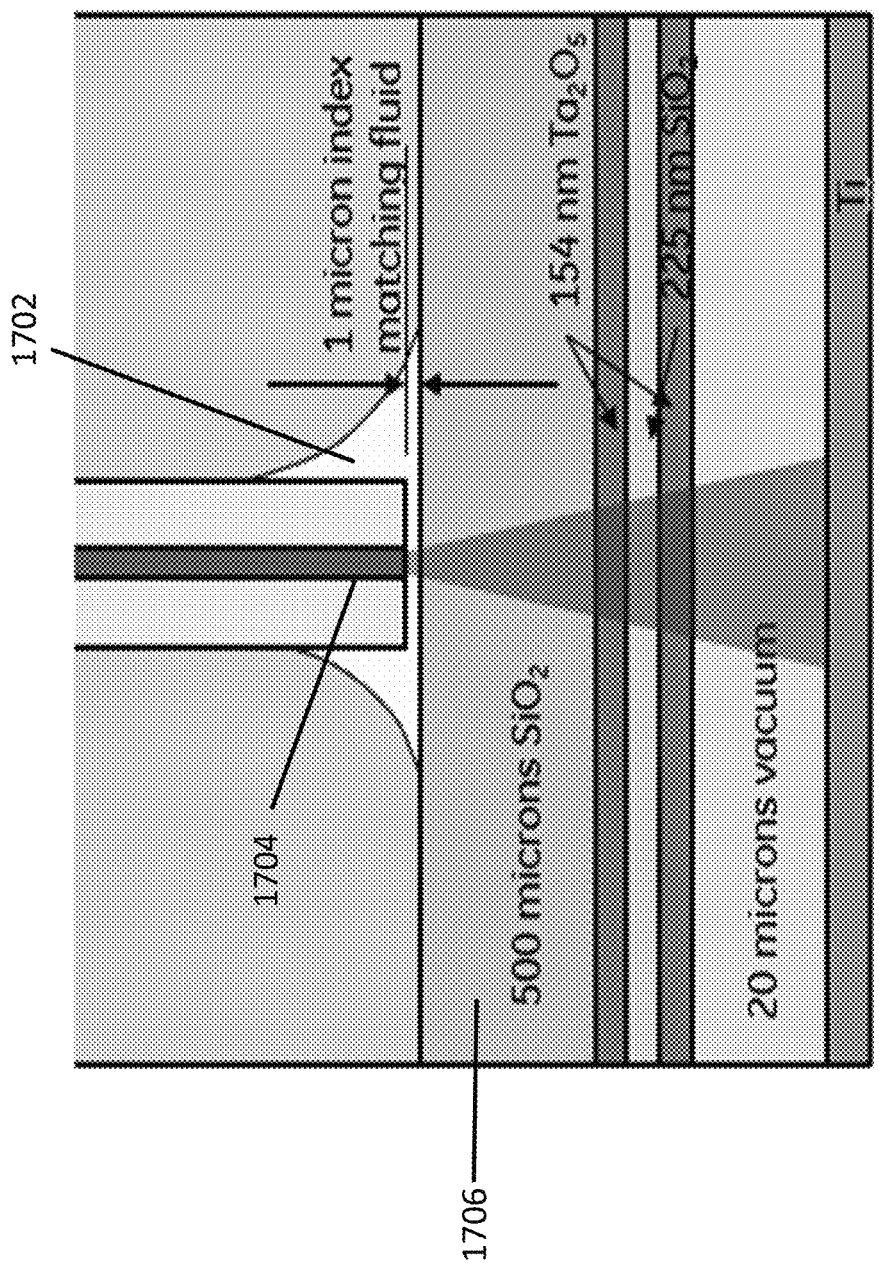
FIG. 17 illustrates the performance of a three-layer reflecting quarter-wave film stack.
Figure 18:
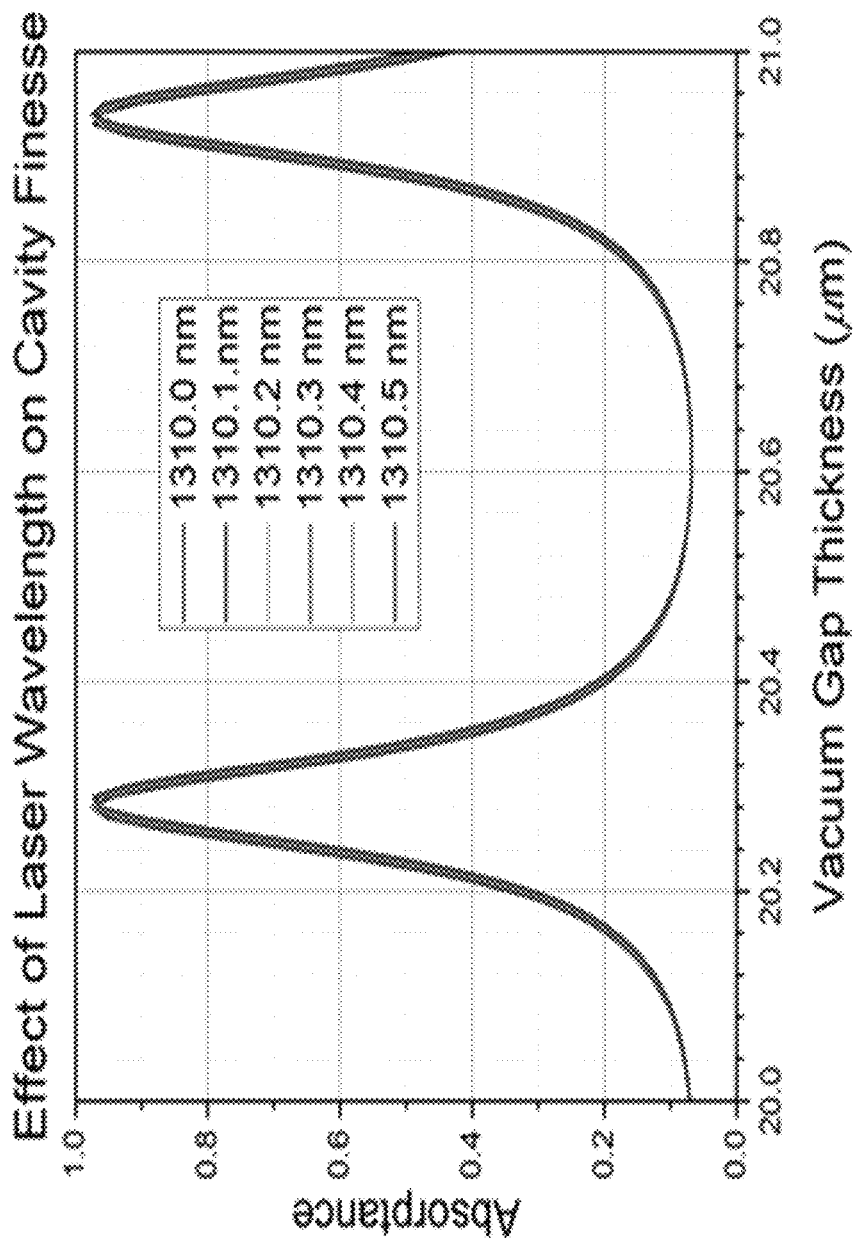
FIG. 18 illustrates the cavity finesse calculated at different wavelengths for the three-layer configuration illustrated in FIG. 17.
Figure 19:
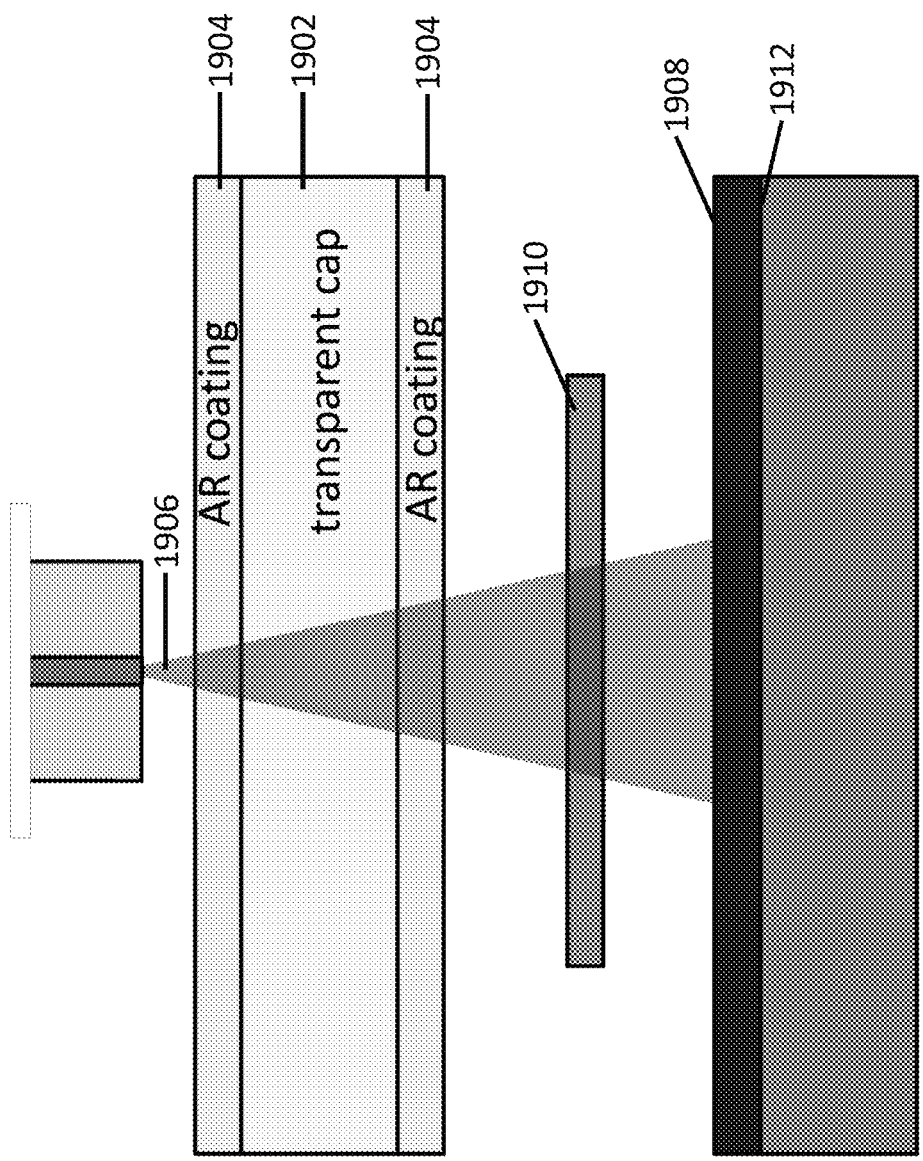
FIG. 19 illustrates examples of medium refractive index materials.

In another embodiment shown in FIG. 17, a three-layer reflecting quarter-wave film stack performs much better than bare silicon. FIG. 18. illustrates the cavity finesse calculated at different wavelengths for the three-layer configuration illustrated in FIG. 17, demonstrating larger finesse and almost no wavelength dependence. The index matching fluid 1702 between the optical fiber 1704 and glass cap 1706 entirely eliminates reflections from the top surface of the cap in this model. The three-layer reflecting quarter-wave film stack illustrated in FIG. 17 may include high, low and high refractive index materials, respectively such that the middle layer is composed of a lower refractive index material and both the top and bottom layers are composed of a high refractive index material. Examples of high refractive index materials include $Ta_2O_5$ and $TiO_2$. Examples of low refractive index materials include $SiO_x$ and $SiO2$. Examples of medium refractive index materials include SiON, SiN and HfO2 In another embodiment shown in FIG. 19, a transparent cap 1902 has an AR-coating 1904 on both sides so that it is completely transparent to the incident laser light 1906 and therefore does not form a part of the optical cavity. On the bottom behind the resonating membrane 1910 is a mirror/reflector 1908. The membrane 1910 itself now is partially transparent, whereas in the previous implementation it was opaque—it did not transmit any light. In this new implementation, the optical cavity is formed between the membrane 1910 and the bottom reflector 1912, rather than between the top cap 1902 and the membrane 1910.

Figure 20:
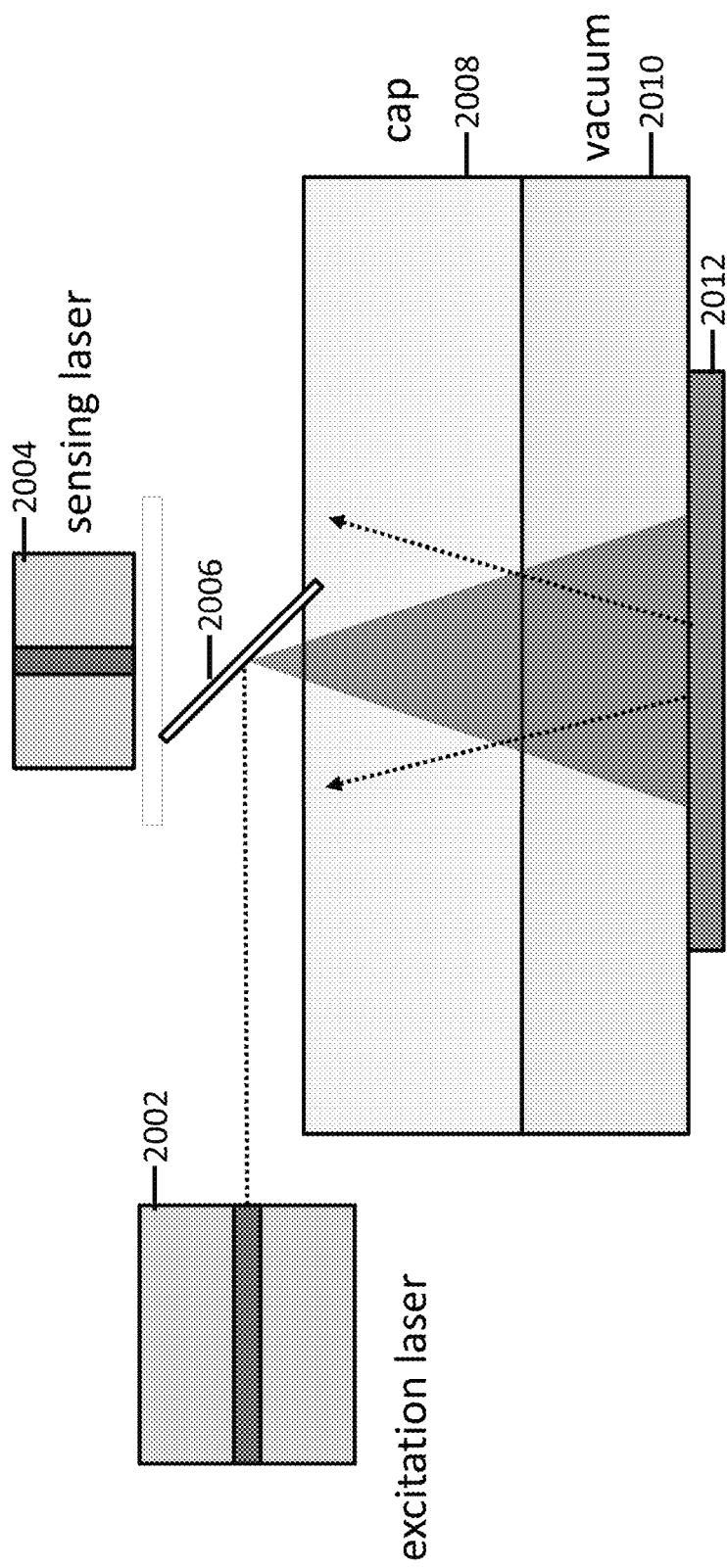
FIG. 20 illustrates an embodiment in which two functions of the laser are split into separate components.

FIG. 20 illustrates another embodiment in which two functions of the laser are split into separate components. An excitation laser 2002 is configured to be orthogonal to a sensing laser 2004. Light from the excitation laser is reflected off of reflector 2006 to resonating membrane 2012 through cap 2008 and vacuum 2010. The sensing laser 2004 then senses vibrations from the resonating membrane 2012. In this embodiment, it may be preferable to separate the excitation and sensing functions of a single laser. Similarly, it may be preferable due to space constraints of the PCB or other components for the excitation laser to be oriented orthogonal to the sensing laser. In such configures, the reflector may be a reflecting surface from the point of view of the excitation laser while simultaneously acting as a transparent surface from the point of view of the sensing laser. In other embodiments, both the sensing and the excitation functions may be achieved by a single laser in the orthogonal configuration occupied by the excitation laser 2002 of FIG. 20. In yet another embodiment, it may be preferable for the positions of the sensing laser 2004 and the excitation laser 2002 to be reversed from the positions shown in FIG. 20.

Figure 21:
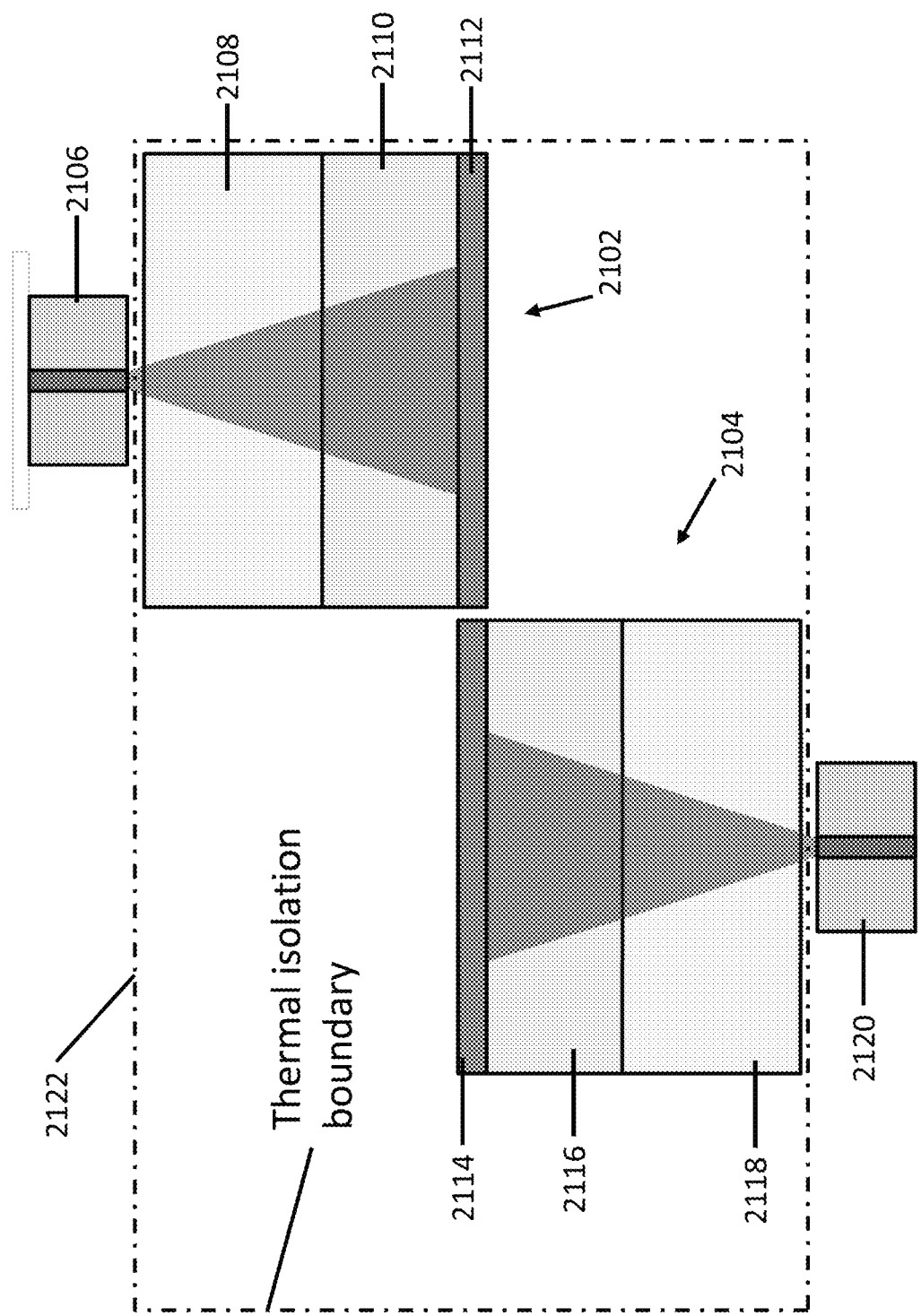
FIG. 21 illustrates an embodiment in which two optical systems are oriented in horizontally adjacent and vertically opposing configurations.

FIG. 21 illustrates another embodiment in which two optical systems are oriented in horizontally adjacent and vertically opposing configurations. In this embodiment, a first system 2102 includes a first laser 2106 located above a first cap 2108 located above a first vacuum 2110 located above a first membrane 2112. A second system 2104 includes a second laser 2120 located below a second cap 2118 located below a second vacuum 2116 located below a second membrane 2114. A thermal isolation boundary 2122 thermally isolates the respective caps, vacuums and membranes of each of the first and second systems such that the components within the thermal isolation boundary are exposed to substantially the same temperatures. In this embodiment, systemic bias and errors introduced by temperature variation will be of equal magnitude in the first system 2102 and second system 2104. However, due to the opposite configurations of the first 2102 and second systems 2104, the system effects due to temperature variation will be either additive or subtractive with the effects on the resonating membrane due to acceleration. The signals of each of the first system 2102 and second system 2104 can be reconciled against each other, allowing system errors due to temperature variation to drop out, resulting in an accurate acceleration reading.

Figure 22:
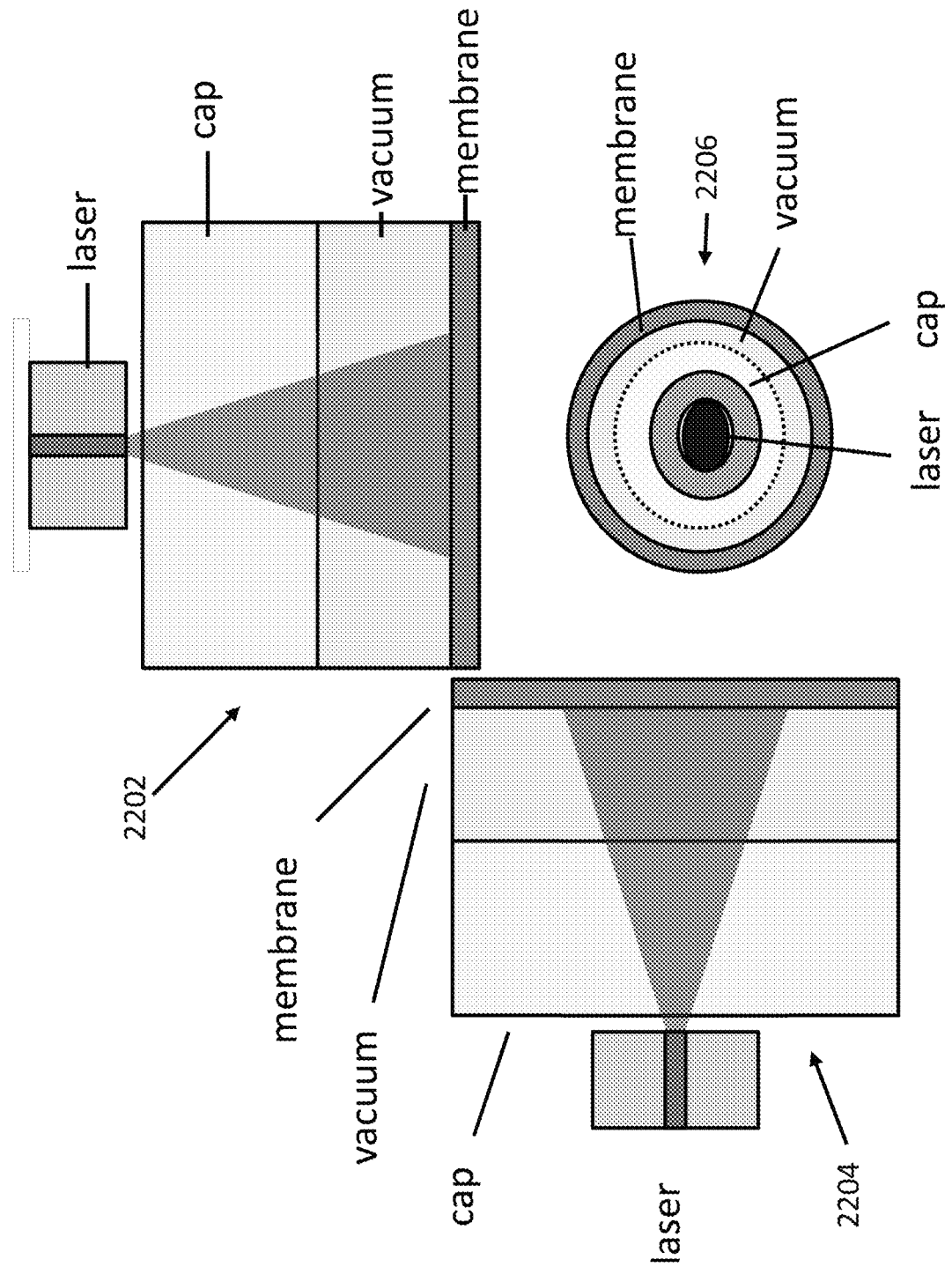
FIG. 22 illustrates an embodiment in which three optical systems are orthogonally oriented in X, Y, and Z directions.

FIG. 22 illustrates another embodiment in which three optical systems are orthogonally oriented in X, Y and Z directions. A first optical system 2202 is oriented so that the laser is directed in a vertical or Y direction. A second optical system 2204 is oriented so that the laser is directed in a horizontal or X direction. A third optical system 2206 is oriented so that the laser is directed into the page, or in a Z direction. This embodiment may be preferred in situations where orienting an optical system in a direction allows the system to be more sensitive to accelerations in that directions. With two or even three systems mutually orthogonal to each other, accelerations in all three spatial dimensions (X, Y and Z) may be sensed accurately.

Figure 23:
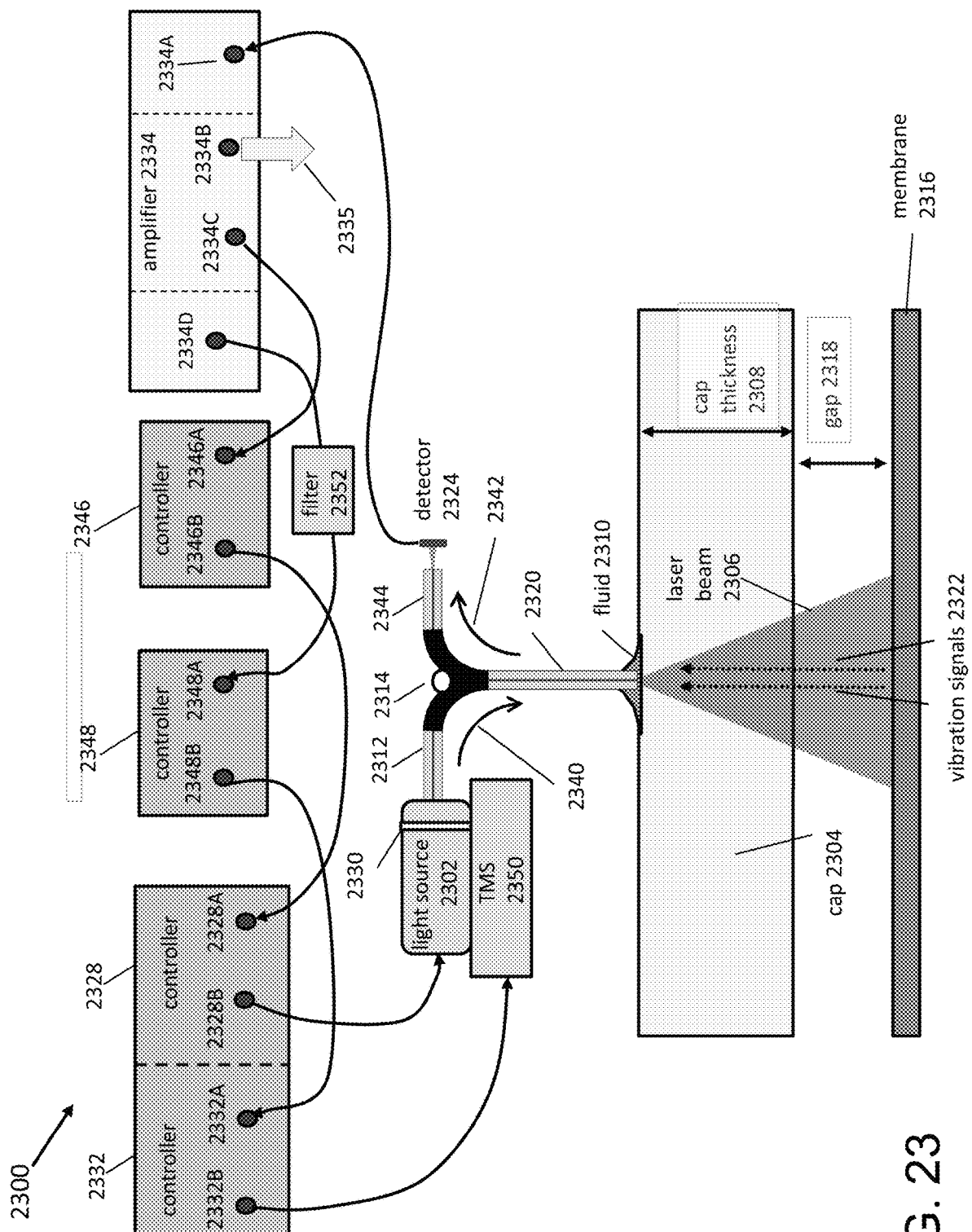
FIG. 23 illustrates an optical accelerometer in a dual feedback loop arrangement.

FIG. 23 illustrates an optical accelerometer 2300 including a light source 2302 emitting a laser beam 2306 through a transparent cap 2304. The cap thickness 2308 may increase or decrease as a function of the temperature of the transparent 2304. An index matching fluid 2310 may be disposed on the surface of the transparent cap 2304 closest the light source 2302. The light source 2302 produces an input signal 2340 at a first port 2312. The input signal 2340 travels past an optical circulator 2314 toward a second port 2320. The input signal 2340 is converted into the laser beam 2306 at the second port 2320 as it travels through the index matching fluid 2310 into cap 2308. The laser beam 2306 travels to a vibrating membrane 2316 which vibrates upon becoming excited by the laser beam 2306. Separating the vibrating membrane 2316 from the transparent cap 2304 is a vacuum gap 2318. At least one vibration signal 2322 propagates from the vibrating membrane 2316 through the vacuum gap 2318 and the transparent cap 2304 back to the second port 2340.

The vibration signal 2322 is converted into an output signal 2342 that travels past the optical circulator 2314 toward a third port 2344. A detector 2324 detects the output signal 2342 at the third port 2344. The optical circulator 2314 enables for the unidirectional travel of optical signals through devices with three ports, 2312, 2320, and 2344 in the present embodiment. As such the input signal 2340 can enter the first port 2312 and exit at the second port 2320 with minimal loss to the signal strength. Similarly, the output signal 2342 can enter the second port 2320 and exit the third port 2344, both with minimal loss to the signal strength and without interfering with the input signal 2340. The vibrating membrane 2316 may be composed of tungsten, titanium, nickel, chromium, nickel-chromium alloys, titanium-tungsten alloys, other compounds and alloys thereof such that the vibrating membrane absorbs about half of the light and reflects the remaining light. As such, the vibrating membrane should neither be a transparent dielectric nor high reflective.

The detector 2324 is communicatively coupled to an amplifier 2334 such as a lock-in amplifier at an input channel 2334A. A first output channel 2334B of the amplifier 2334 produces an accelerometer output signal 2335 representative of acceleration. A second output channel 2334C of the amplifier 2334 is communicatively coupled to an automatic gain controller 2346 via input channel 2346A. A third output channel 2334D of the amplifier 2334 is communicatively coupled to a PID controller 2348 via input channel 2348A. An output channel 2346B of the automatic gain controller 2346 is communicatively coupled to a light source power controller 2328 via input channel 2328A. An output channel 2328B of the light source power controller 2328 is communicatively coupled to the light source 2302 for controlling at least one power parameter (such as current or voltage) of the light source 2302. An output channel 2348B of the PID controller 2348 is communicatively coupled to a temperature controller 2332 via an input channel 2332A. An output channel 2332B of the temperature controller 2332 is communicatively coupled to a thermal management system 2350 used for controlling the temperature of the laser or light source 2302. The thermal management system (TMS) 2350 is in thermal communication with the light source 2302 and can both cool and heat the light source 2302.

The laser power controller 2328 controls the power of the light source 2302 which may include one or more distributed feedback (DFB) laser diode 2330. In the embodiment shown in FIG. 23 the optical accelerometer 2300 may include the lock-in amplifier 2334 for increasing or maintaining the amplitude of at least one characteristic of the laser beam 2306 and/or the vibration signals 2322. The vibration signals 2322 are caused by oscillations of the vibrating membrane 2316.

The accelerometer 2300 may also include a low pass electronic filter 2352 for smoothing the signal prior to the signal being received at the PID controller 2348. The low pass electronic filter 2352 acts to reduce noise introduced during the signal change within the amplifier 2334 or elsewhere. The low pass electronic filter 2352 may be incorporated within the amplifier 2334 as an integral component, or it may be a standalone component communicatively between the amplifier 2334 and the PID controller 2348.

In operation, the optical accelerometer 2300 uses the temperature controller 2332 and the laser power controller 2328 to adjust a laser wavelength and laser amplitude, respectively, to maintain nearly constant vibration signals 2322 as sensed by the detector 2324, in order to account for variations in the temperature of the transparent cap 2304. The temperature controller 2332 and the laser power controller 2328 may be mechanically coupled or may be disposed in partitioned portions of a single electrical device. Alternatively, temperature controller 2332 and the laser power controller 2328 may be physically separated from one another. In one embodiment, the cap thickness 2308 is about 500 microns and the vacuum gap 2318 is about 20 microns. In another embodiment, the cap thickness 2308 is in a range of about 10 to about 100 times thicker than the vacuum gap 2318. In another embodiment, the cap thickness 2308 is in a range of about 15 to about 50 times thicker than the vacuum gap 2318. In another embodiment, the cap thickness 2308 is about 25 times thicker than the vacuum gap 2318.

Figure 24:
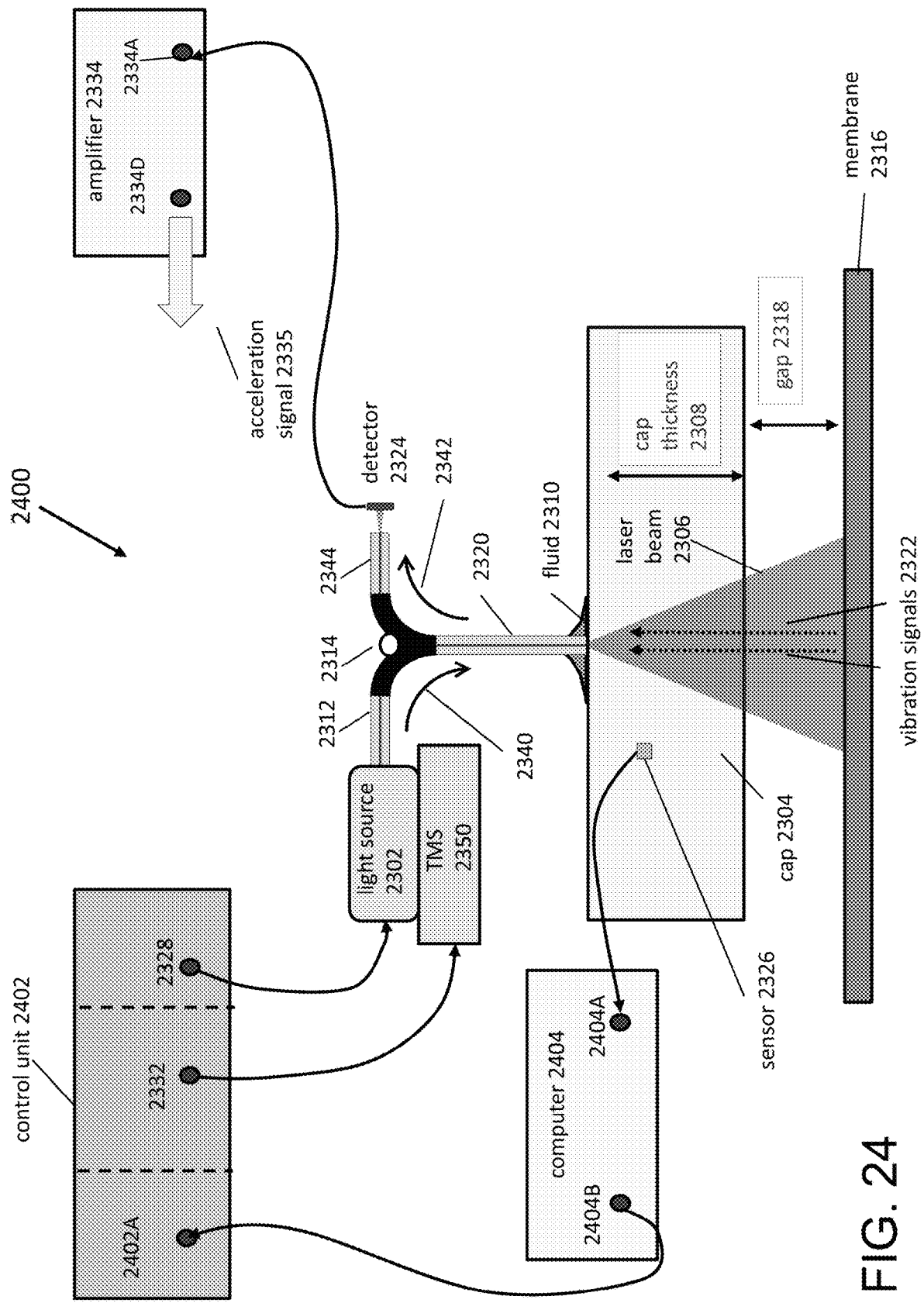
FIG. 24 illustrates an optical accelerometer in a dual feedback loop arrangement.

FIG. 24 illustrates an alternate embodiment of accelerometer 2400 including a temperature sensor 2326 for sensing the temperature of the transparent cap 2304. The temperature sensor 2326, which is communicatively coupled to a computer 2404 via input channel 2404A, may be a thermistor, thermocouple, RTD or other temperature sensing device. The computer 2404 is communicatively coupled to a control unit 2402 via output channel 2404B and input channel 2402A. In addition to receiving inputs from the computer 2404, the control unit may also house the temperature controller 2332 and the laser power controller 2328. Each of the input channel 2402A, the temperature controller 2332, and the laser power controller 2328 may be housed in separate and/or partitioned portions of the control unit 2402.

In operation, the optical accelerometer 2400 uses the computer 2404 to directly set the laser 2302 temperature via the TMS 2350 and the laser current via the laser power controller 2328, based on a measurement of the device temperature from the temperature sensor 2326. As a result, there is no PID feedback loop in the embodiment shown in FIG. 24. The computer 2404 closes a feedback loop digitally instead of utilizing analog electronics. In this case, there is no error signal from the second harmonic out of the lock-in necessary for a feedback loop, but it does require an independent measurement of the cap temperature to calculate the laser parameters (current and/or voltage and temperature). The computer 2404 may use an algorithm to determine desired laser temperature and current based on pre-calibrating the system by varying the temperature of the transparent cap 2304 and adjusting the laser current and temperature to maintain the amplitude of the vibration signals 2322. The computer 2404 may use a look-up table stored in the computer 2404, or alternatively a transfer function defining the relationship between the temperature of the transparent cap 2304 and necessary adjustments to both the laser 2302 current and temperature.

The embodiments illustrated in FIGS. 23 and 24 both include two feedback loops: a first feedback loop used to control the power of the laser or light source 2302, and a second feedback loop used to control the temperature of the laser or light source 2302. In the first feedback loop illustrated in FIG. 23, the signal received at the amplifier 2334 from the detector 2324 is passed to the automatic gain controller 2346 and then to the laser power controller 2328 which adjusts the power to the light source 2302, which changes the laser amplitude, which in turn is detected at the detector 2324 via the vibration signals. In the second feedback loop, as also illustrated in FIG. 23, the signal received at the amplifier 2334 from the detector 2324 is passed to the PID controller 2348 and then to the laser temperature controller 2332 which adjusts the temperature of the light source 2302, which changes the laser wavelength, which in turn is detected at the detector 2324 via the vibration signals 2322. In the embodiment of FIG. 24, for both the first and second feedback loops the computer 2404 receives temperature signals from the temperature sensor 2326 and passes a signal to the control unit 2402 which passes a signal to both the temperature controller 2332 and the laser power controller 2328, which adjust the respective laser parameters accordingly.

In the embodiments described herein, variations in gap thickness due to temperature variations may be overcome by varying laser temperature, laser current and/or laser power. Such embodiments result in the accurate sensing of acceleration through a wide environmental temperature range. Such embodiments are useful in applications where sensing acceleration is desired such as in vehicles including planes, bikes, cars, trains, boats, rockets; personal electronics including smart phones, tablets, wearable fitness devices, portable music players, headsets, communication devices, fitness trackers, watches, drones, and other applications that include moving components. In other embodiments described herein, reducing or eliminating a top reflection while utilizing materials with substantially equal refractive indices may mitigate errors and sensor biases introduced as a result of environmental temperature variation. These embodiments are useful in a wide variety of applications, as discussed above.

Embodiments of the resonant opto-mechanical accelerometer thus include a light source, such as a laser, a first resonator, and a second resonator. A resonance frequency of each resonator is responsive to an acceleration, and the light source shines a light beam on each resonator. The resonators modulate the light to a frequency that corresponds to the resonance frequency, and the modulated light is sensed at each resonator by a corresponding photodetector. The photodetectors generate first and second electrical output signals in response, and these electrical output signals are used to generate a temperature independent acceleration measurement. In addition, a plurality of electrodes are disposed in relation to each resonator, such that one or more proof masses associated with each resonator may be dynamically balanced and/or a scale factor associated with the modulated light increased or decreased as a function of acceleration.

Exemplary technical effects of the resonant electro-optical accelerometer described herein include, for example: (a) optical self-excitation and detection; (b) real-time dynamic resonator balancing; (c) real-time adjustments to scale factor; and (d) differential resonator output for temperature independent acceleration measurement.

Exemplary embodiments of a resonant opto-mechanical accelerometer and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where acceleration measurement is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An accelerometer comprising:
   a membrane;
   an energy source, the energy source producing a laser beam, the laser beam directed at the membrane causing it to vibrate;
   a transparent cap, the transparent cap disposed at one end of the energy source;
   a first controller for adjusting an output power of the energy source in a first feedback loop;
   a second controller for controlling the wavelength of the laser beam in a second feedback loop; and
   a detector sensing a reflected portion of the laser beam,
   wherein an acceleration signal is based in part on the frequency of the reflected portion of the laser beam.

2. The accelerometer of claim 1 further comprising a vacuum gap positioned between the transparent cap and the membrane.

3. The accelerometer of claim 2, wherein the transparent cap comprises a first thickness,
   wherein the vacuum gap comprises a second thickness, and
   wherein the first thickness is in a range of about 10 to about 100 times greater than the second thickness.

4. The accelerometer of claim 1, further comprising an amplifier communicatively coupled to the detector,
   wherein the detector passes at least one electronic signal representative of the reflected portion of the laser beam to the amplifier, and
   wherein the amplifier maintains or increases the amplitude of at least one characteristic of the at least one electronic signal.

5. The accelerometer of claim 4 further comprising:
   at least one automatic gain controller communicatively coupled to the amplifier; and
   at least one proportional integral differential (PID) controller communicatively coupled to the amplifier.

6. The accelerometer of claim 5, wherein the at least one automatic gain controller is communicatively coupled to the first controller, and
   wherein the at least one automatic gain controller is part of the first feedback loop.

7. The accelerometer of claim 5, wherein the at least one PID controller is communicatively coupled to the second controller, and
   wherein the second feedback loop comprises the at least one PID controller.

8. The accelerometer of claim 7 further comprising a low pass electronic filter,
   wherein the low pass electronic filter is communicatively coupled to the at least one PID controller upstream of the at least one PID controller.

9. The accelerometer of claim 8, the transparent cap further comprising:
   a first surface, the first surface adjacent the energy source;
   a second surface, the second surface proximate the membrane; and
   an index matching fluid, the index matching fluid disposed on the first surface.

10. The accelerometer of claim 1 further comprising at least one optical fiber, the at least one optical fiber transporting energy from the energy source to the transparent cap;
    the transparent cap further comprising:
    a first surface, the first surface adjacent the energy source;
    a second surface, the second surface proximate the membrane; and
    an index matching fluid, the index matching fluid disposed between the at least one optical fiber and the first surface,
    wherein the index-matching fluid has substantially the same refractive index as the at least one optical fiber.

11. The accelerometer of claim 1, wherein the membrane at least partially comprises at least one of tungsten, titanium, nickel, chromium, a nickel-chromium alloy, and a titanium-tungsten alloy.

12. The accelerometer of claim 1 further comprising at least one temperature sensor, the at least one temperature sensor disposed on the transparent cap for sensing a temperature of the transparent cap.

13. The accelerometer of claim 12 further comprising a computing device, wherein the computing device receives at least one signal representative of a temperature of the transparent cap from the at least one temperature sensor, and
    wherein the computing device digitally closes the first and second feedback loops based at least in part on the temperature of the transparent cap.

14. The accelerometer of claim 13, wherein the computing device is communicatively coupled to both the second controller and the first controller.

15. The accelerometer of claim 1, wherein a wavelength of the laser beam modulates as the second controller adjusts a temperature of the energy source.

16. The accelerometer of claim 1, wherein an amplitude of the laser beam modulates as the first controller adjusts the output power of the energy source.

17. A method of measuring acceleration, the method comprising:
    providing a membrane within a laser beam;
    oscillating the membrane with energy from the laser beam;
    adjusting the temperature of a source of the laser beam, causing a wavelength of the laser beam to modulate;

adjusting a power output of the source of the laser beam, causing an amplitude of the laser beam to modulate;

detecting at least one variation in the oscillating membrane; and providing at least one signal representative of an oscillation of the membrane to both a first feedback loop and a second feedback loop, wherein adjusting the temperature of a source of the laser beam uses at least one input from the first feedback loop, wherein adjusting a power output of the source of the laser beam uses at least one input from the second feedback loop, and wherein an acceleration signal is based in part on the frequency of an amplitude modulation of a reflected portion of the laser beam.

18. An optical accelerometer comprising:

an energy source, the energy source producing a laser beam;

a membrane, the membrane at least partially disposed within the laser beam;

a laser power controller for adjusting an output power of the energy source causing an amplitude of the laser beam to modulate;

a temperature controller for adjusting the temperature of the energy source causing a wavelength of the laser beam to modulate; and a detection device, the detection device sensing at least one oscillation of the membrane, wherein the laser power controller and the temperature controller are both arranged in a feedback loop with the detection device to maintain the at least one oscillation of the membrane, and wherein an acceleration signal is based in part on the frequency of an amplitude modulation of a reflected portion of the laser beam.

19. The optical accelerometer of claim 18, further comprising a lock-in amplifier communicatively coupled to the detection device for maintaining or increasing an amplitude of at least one characteristic of the laser beam.

20. The optical accelerometer of claim 18, further comprising an optical circulator, wherein the optical circulator comprises three ports, each port of the three ports coupled in optical communication with one of the energy source, the membrane, and the detection device.

* * * * *